(12) United States Patent
Lin et al.

(10) Patent No.: US 11,121,031 B2
(45) Date of Patent: Sep. 14, 2021

(54) MANUFACTURING METHOD OF CHIP PACKAGE AND CHIP PACKAGE

(71) Applicant: XINTEC INC., Taoyuan (TW)

(72) Inventors: Chia-Sheng Lin, Taoyuan (TW);
Hui-Hsien Wu, Taoyuan (TW);
Jian-Hong Chen, Taoyuan (TW);
Tsang-Yu Liu, Zhubei (TW); Kuei-Wei Chen, Taoyuan (TW)

(73) Assignee: XINTEC INC., Taoyuan (TW)

( * ) Notice: Subject to any disclaimer, the term of this patent is extended or adjusted under 35 U.S.C. 154(b) by 61 days.

(21) Appl. No.: 16/668,570

(22) Filed: Oct. 30, 2019

(65) Prior Publication Data

US 2020/0144116 A1    May 7, 2020

Related U.S. Application Data

(60) Provisional application No. 62/754,349, filed on Nov. 1, 2018, provisional application No. 62/900,949, filed on Sep. 16, 2019.

(51) Int. Cl.
| | | |
|---|---|---|
| *H01L 21/768* | (2006.01) | |
| *H01L 23/00* | (2006.01) | |
| *H01L 21/02* | (2006.01) | |

(52) U.S. Cl.
CPC .. *H01L 21/76894* (2013.01); *H01L 21/02013* (2013.01); *H01L 24/94* (2013.01)

(58) Field of Classification Search
None
See application file for complete search history.

(56) References Cited

U.S. PATENT DOCUMENTS

| | | | |
|---|---|---|---|
| 2010/0007030 A1 | 1/2010 | Koike et al. | |
| 2013/0307125 A1* | 11/2013 | Huang | H01L 23/3121 |
| | | | 257/623 |
| 2014/0328523 A1* | 11/2014 | Lin | H01L 21/6835 |
| | | | 382/124 |
| 2015/0123231 A1* | 5/2015 | Chien | H01L 31/02363 |
| | | | 257/432 |
| 2017/0005050 A1* | 1/2017 | Lin | G06K 9/00013 |
| 2017/0092540 A1 | 3/2017 | Rohleder et al. | |
| 2017/0179330 A1* | 6/2017 | Suen | H01L 31/1804 |
| 2017/0213865 A1* | 7/2017 | Yiu | H01L 27/14627 |
| 2018/0102321 A1 | 4/2018 | Ho et al. | |
| 2018/0315713 A1* | 11/2018 | Roesner | H01L 23/544 |
| 2019/0006404 A1* | 1/2019 | Wang | H01L 27/14634 |

* cited by examiner

*Primary Examiner* — Alexander G Ghyka
(74) *Attorney, Agent, or Firm* — Liu & Liu

(57) ABSTRACT

A manufacturing method of a chip package includes patterning a wafer to form a scribe trench, in which a light-transmissive function layer below the wafer is in the scribe trench, the light-transmissive function layer is between the wafer and a carrier, and a first included angle is formed between an outer wall surface and a surface of the wafer facing the light-transmissive function layer; cutting the light-transmissive function layer and the carrier along the scribe trench to form a chip package that includes a chip, the light-transmissive function layer, and the carrier; and patterning the chip to form an opening, in which the light-transmissive function layer is in the opening, a second included angle is formed between an inner wall surface of the chip and a surface of the chip facing the light-transmissive function layer, and is different from the first included angle.

8 Claims, 28 Drawing Sheets

MANUFACTURING METHOD OF CHIP PACKAGE AND CHIP PACKAGE

RELATED APPLICATIONS

This application claims priority to U.S. Provisional Application Ser. No. 62/754,349, filed Nov. 1, 2018, and U.S. Provisional Application Ser. No. 62/900,949, filed Sep. 16, 2019, which are herein incorporated by reference.

BACKGROUND

Field of Invention

The present invention relates to a manufacturing method of a chip package and a chip package.

Description of Related Art

Generally, when a chip package for sensing light is being manufactured, a wafer and a function layer can be first bonded to a carrier, and then the wafer is subjected to an etching process such that an opening of a sensing area and a scribe trench for a subsequent cutting process can be simultaneously formed on the wafer. In a subsequent process, an isolation layer of the wafer in the opening can be removed to expose the function layer, and then a step of cutting the function layer and the carrier along the scribe trench is performed to form a chip package.

However, when the function layer and the carrier are being cut, the sensing area is susceptible to damage, such as contamination, which makes it difficult to improve the product yield. In addition, since the opening of the sensing area and the scribe trench are simultaneously formed on the wafer during the etching process, an inner wall surface of the wafer facing the opening of the sensing area and an outer wall surface of the wafer facing the scribe trench are substantially angled equally. As a result, the foregoing chip package cannot be applied to different types of optical sensors.

SUMMARY

An aspect of the present invention provides a manufacturing method of a chip package.

According to an embodiment of the present invention, a manufacturing method of a chip package includes patterning a wafer to form a scribe trench, in which a light-transmissive function layer below the wafer is in the scribe trench, the light-transmissive function layer is between the wafer and a carrier, the wafer has an outer wall surface facing the scribe trench, and a first included angle is formed between the outer wall surface and a surface of the wafer facing the light-transmissive function layer; cutting the light-transmissive function layer and the carrier along the scribe trench to form a chip package, in which the chip package includes a chip, the light-transmissive function layer, and the carrier; and patterning the chip to form an opening that defines a sensing area, in which the light-transmissive function layer is in the opening, the chip has an inner wall surface surrounding the opening and an outer wall surface that faces away from the inner wall surface, a second included angle is formed between the inner wall surface and a surface of the chip facing the light-transmissive function layer, and the first included angle is different from the second included angle.

In an embodiment of the present invention, the foregoing manufacturing method of a chip package further includes grinding a surface of the wafer facing away from the light-transmissive function layer.

In an embodiment of the present invention, the foregoing manufacturing method of a chip package further includes forming a supporting part on the carrier or on the light-transmissive function layer; and bonding the carrier to the light-transmissive function layer such that the supporting part is located between the carrier and the light-transmissive function layer.

In an embodiment of the present invention, the foregoing cutting the light-transmissive function layer and the carrier along the scribe trench includes: cutting the light-transmissive function layer and a portion of the carrier with a cutter to form a recess; and cutting another portion of the carrier with a laser along the recess.

In an embodiment of the present invention, the foregoing cutting the light-transmissive function layer and the carrier along the scribe trench includes: cutting the light-transmissive function layer with a first laser to form a recess; and cutting the carrier with a second laser along the recess.

In an embodiment of the present invention, the foregoing cutting the light-transmissive function layer and the carrier along the scribe trench includes: cutting a portion of the light-transmissive function layer with a cutter to form a recess; and cutting another portion of the light-transmissive function layer and the carrier with a laser along the recess.

In an embodiment of the present invention, the foregoing cutting the light-transmissive function layer and the carrier along the scribe trench is performed by means of a cutter or a laser.

In an embodiment of the present invention, the foregoing chip has a first isolation layer and a second isolation layer on the light-transmissive function layer, the second isolation layer is located between the light-transmissive function layer and the first isolation layer; and the manufacturing method of a chip package further includes etching the first isolation layer in the opening and etching the first isolation layer covering a conductive pad of the chip, such that the second isolation layer in the opening is exposed and the conductive pad is exposed.

An aspect of the present invention provides a chip package.

According to an embodiment of the present invention, a chip package includes a chip, a carrier and a light-transmissive function layer. The chip has a conductive pad, an opening defining a sensing area, an inner wall surface surrounding the opening, and an outer wall surface facing away from the inner wall surface. The light-transmissive function layer is located between the chip and the carrier. A first portion of the light-transmissive function layer is located in the opening. A second portion of the light-transmissive function layer is covered by the chip. A third portion of the light-transmissive function layer protrudes from the outer wall surface of the chip, and the conductive pad is located on the third portion. A first included angle is formed between the outer wall surface of the chip and a surface of the chip facing the light-transmissive function layer. A second included angle is formed between the inner wall surface and the surface of the chip facing the light-transmissive function layer, and the first included angle is different from the second included angle.

In an embodiment of the present invention, the foregoing first included angle is smaller than the second included angle.

In an embodiment of the present invention, the foregoing chip has a first isolation layer and a second isolation layer that surround the opening, the second isolation layer is located on the light-transmissive function layer and protrudes from the outer wall surface of the chip, and the conductive pad is located on the second isolation layer.

In an embodiment of the present invention, the foregoing chip package further includes a supporting part. The supporting part is located between the light-transmissive function layer and the carrier.

In an embodiment of the present invention, the foregoing supporting part overlaps the second portion and the third portion of the light-transmissive function layer.

In an embodiment of the present invention, the foregoing carrier protrudes from a side face of the light-transmissive function layer.

In an embodiment of the present invention, the side face of the foregoing light-transmissive function layer has an inclined part, and an obtuse angle is formed between the inclined part and the carrier that protrudes from the side face of the light-transmissive function layer.

In an embodiment of the present invention, the foregoing carrier and the light-transmissive function layer commonly has a curved surface with the light-transmissive function layer, and the curved surface is adjacent to a side face of the light-transmissive function layer and a side face of the carrier.

In an embodiment of the present invention, the side face of the foregoing light-transmissive function layer is substantially parallel to the side face of the carrier.

In an embodiment of the present invention, the side face of the foregoing light-transmissive function layer is coplanar with the side face of the carrier.

In the foregoing embodiment of the present invention, since the wafer is patterned to form the scribe trench, then the light-transmissive function layer and the carrier are cut along the scribe trench, and then the chip is patterned to form the opening that defines the sensing area, the sensing area of the chip can be prevented from damage in the cutting process, thereby improving the product yield. In addition, the step of forming the scribe trench by the wafer and the step of forming the opening by the chip are not performed simultaneously, such that an inclination angle of the inner wall surface of the chip surrounding the opening and an inclination angle of the outer wall surface facing away from the inner wall surface (namely the outer wall surface facing the scribe trench) can be determined as required by the designer. In this way, the manufacturing method of a chip package and the chip package can be applied to different kinds of optical sensors.

An aspect of the present invention provides a manufacturing method of a chip package.

According to an embodiment of the present invention, a manufacturing method of a chip package includes attaching a side of a package structure to a first adhesive tape, where the package structure has a carrier facing away from the side, and the carrier has a plane; cutting the package structure from the plane of the carrier with a modified laser; attaching a second adhesive tape to the plane of the carrier; removing the first adhesive tape; and expanding the second adhesive tape to divide the package structure into a plurality of chip packages.

In an embodiment of the present invention, the foregoing package structure further includes a wafer and a supporting part located between the wafer and the carrier, and cutting the package structure from the plane of the carrier with a modified laser further includes cutting the wafer and the supporting part with the modified laser.

In an embodiment of the present invention, the foregoing package structure further includes a wafer and a light-transmissive function layer located between the wafer and the carrier, and cutting the package structure from the plane of the carrier with a modified laser further includes cutting the light-transmissive function layer with the modified laser.

In an embodiment of the present invention, the forgoing cutting the package structure from the plane of the carrier with a modified laser forms an internal stress layer on a side face of the carrier and a crack extending up and down from the internal stress layer, such that a line mark is formed on a side face of the light-transmissive function layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
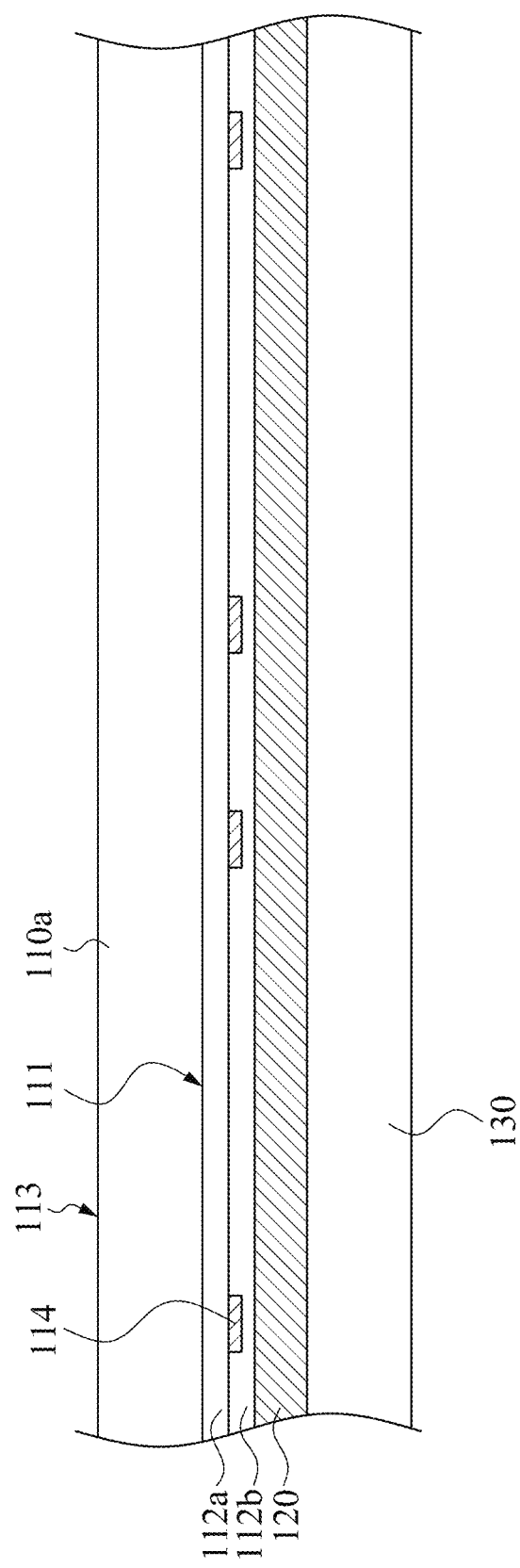
FIGS. 1-11 illustrate cross-sectional views of steps of a manufacturing method of a chip package according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIGS. 1-11 illustrate cross-sectional views of steps of a manufacturing method of a chip package according to an embodiment of the present invention. Referring to FIG. 1, a wafer 110a and a light-transmissive function layer 120 are bonded to a carrier 130, such that the light-transmissive function layer 120 is located between the wafer 110a and the carrier 130. After the wafer 110a and the light-transmissive function layer 120 are bonded to the carrier 130, a surface 113 of the wafer 110a facing away from the light-transmissive function layer 120 can be ground. In this embodiment, the wafer 110a has a first isolation layer 112a and a second isolation layer 112b on the light-transmissive function layer 120, and has a conductive pad 114 located in the second isolation layer 112b. The first isolation layer 112a and the second isolation layer 112b may be of the same material. The material of the wafer 110a may be silicon. The material of the light-transmissive function layer 120 may be a polymer, such as a high polymer material. The material of the carrier 130 may be glass.

Figure 2:
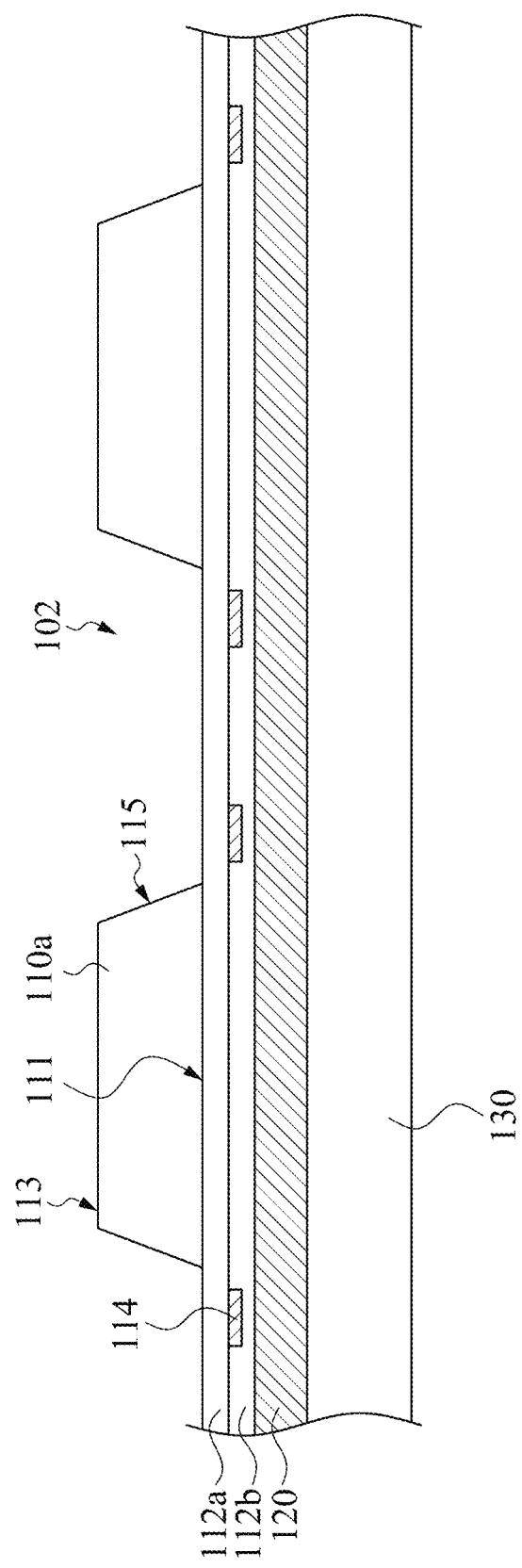

Next referring to FIG. 2, the wafer 110a can be patterned to form a scribe trench 102, such as by applying an etching process to the wafer 110a. The first isolation layer 112a, the second isolation layer 112b, the conductive pad 114 and the light-transmissive function layer 120 are located in the scribe trench 102. The wafer 110a has an outer wall surface 115 facing the scribe trench 102, and a first included angle $\theta1$ is formed between the outer wall surface 115 and a surface 111 of the wafer 110a facing the light-transmissive function layer 120.

Figure 3:
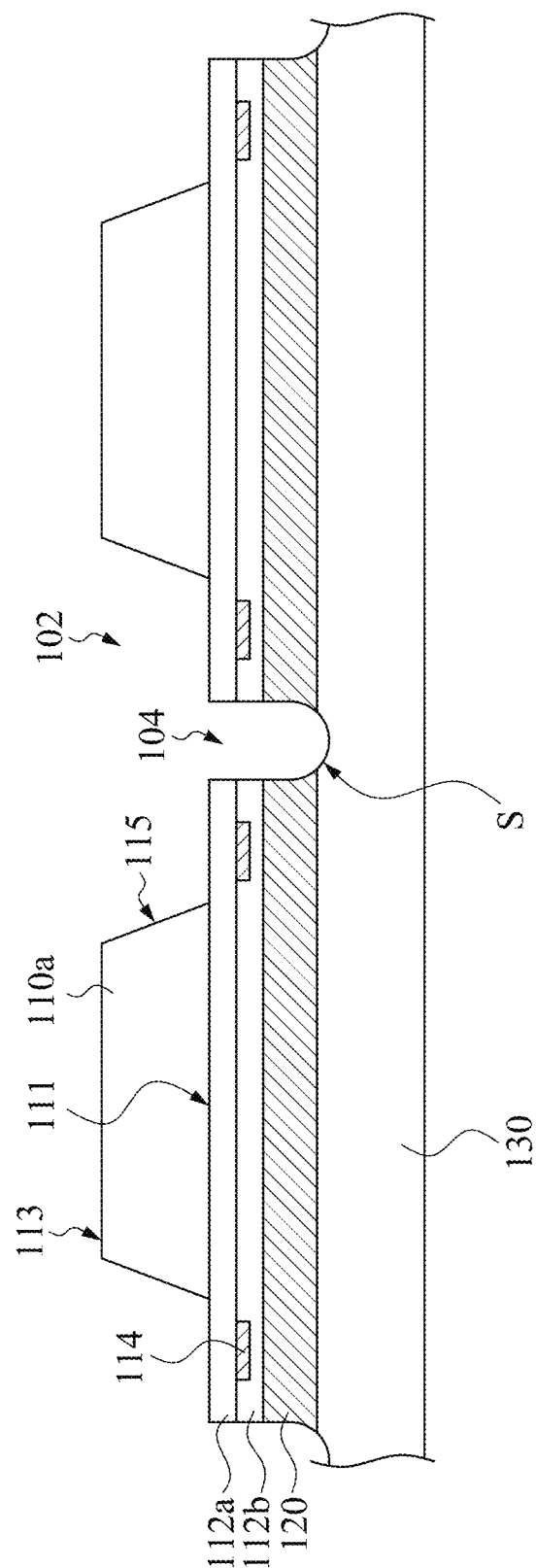
Figure 4:
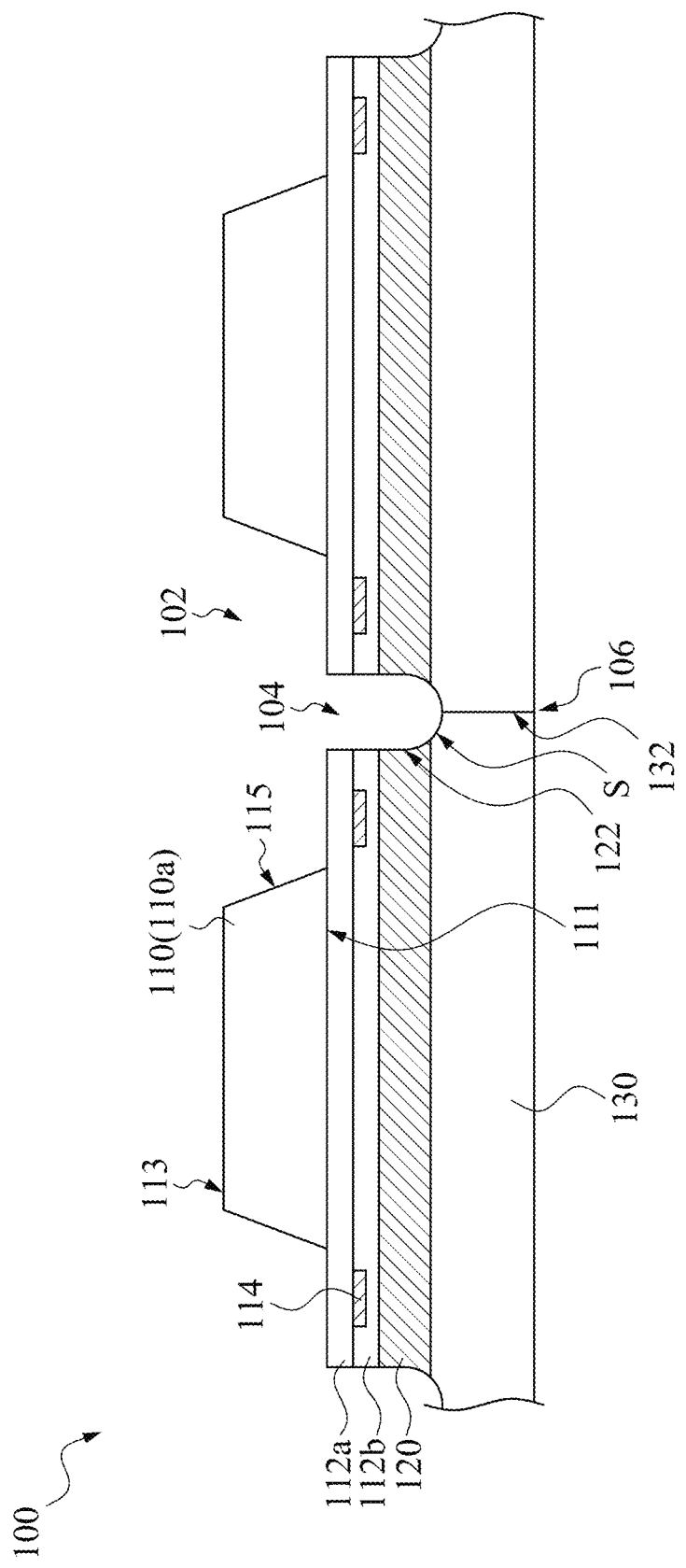

Referring to FIGS. 3 and 4, next, the first isolation layer 112a, the second isolation layer 112b, the light-transmissive function layer 120 and the carrier 130 can be cut along the scribe trench 102 to form a chip package 100. In this embodiment, the light-transmissive function layer 120 and a portion of the carrier 130 can be first cut with a cutter to form a recess 104. Next, another portion of the carrier 130 is cut with a laser along the recess 104, that is, the carrier 130 below the recess 104 is cut with a laser to form a gap 106. Through the foregoing steps, the carrier 130 protrudes from a side face 122 of the light-transmissive function layer 120. The carrier 130 and the light-transmissive function layer commonly has a curved surface S with the light-transmissive function layer 120, and the curved surface S is adjacent to a side face 132 of the light-transmissive function layer 120 and a side face 132 of the carrier 130 after cutting. A width of the gap 106 is smaller than a width of the recess 104.

In addition, the chip package 100 includes the chip 110 as well as the first isolation layer 112a, the second isolation layer 112b, the light-transmissive function layer 120, and the carrier 130 after cutting. Herein, the chip 110 refers to a portion of the wafer 110a after cutting.

Figure 5:
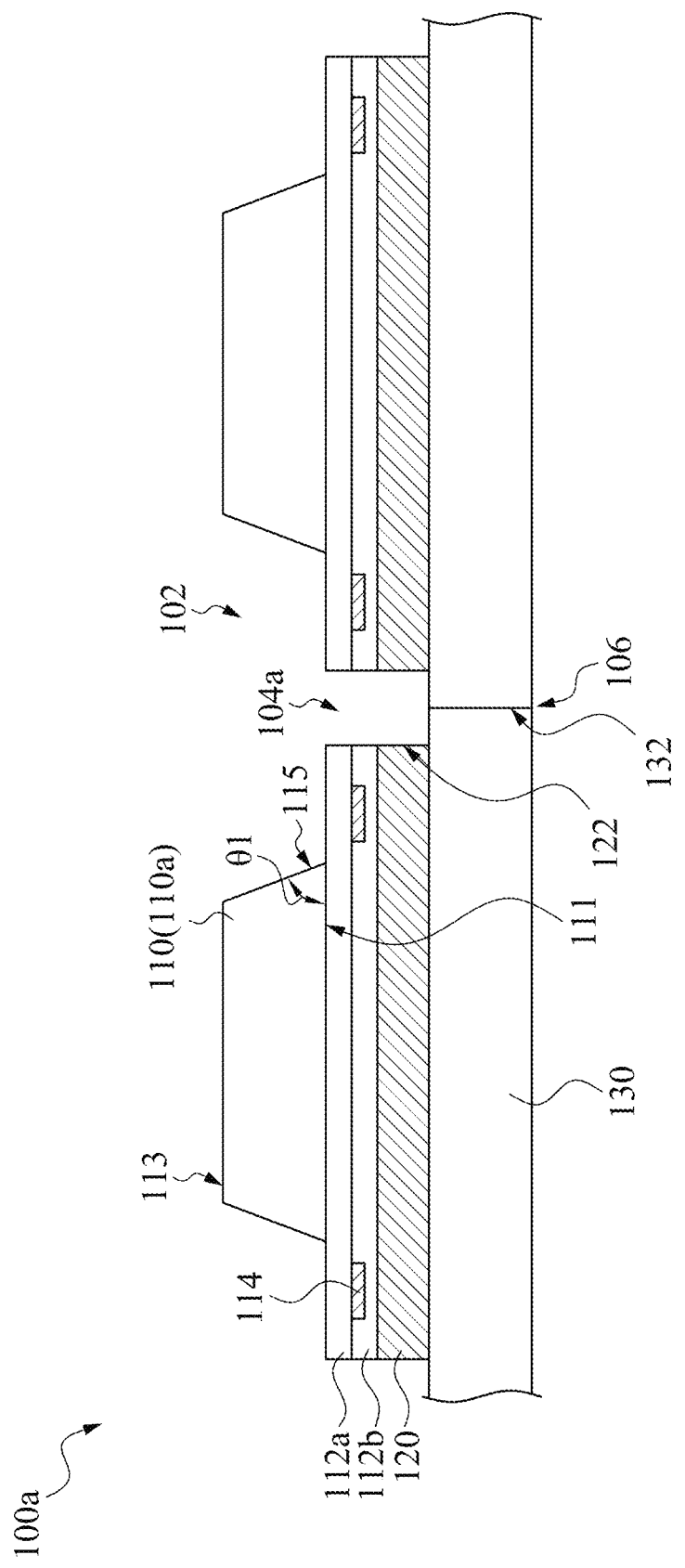

Referring to FIG. 5, in another embodiment, the first isolation layer 112a, the second isolation layer 112b and the light-transmissive function layer 120 can be first cut with a first laser along the scribe trench 102 to form a recess 104a, and then the carrier 130 is cut with a second laser along the recess 104a to form a chip package 100a. The first laser and the second laser may have different parameters, such as different powers, to form the recess 104a and the gap 106 of different widths. The width of the gap 106 is smaller than that of the recess 104a. In this embodiment, the side face 122 of the light-transmissive function layer 120 of the chip package 100a is substantially parallel to the side face 132 of the carrier 130.

Figure 6:
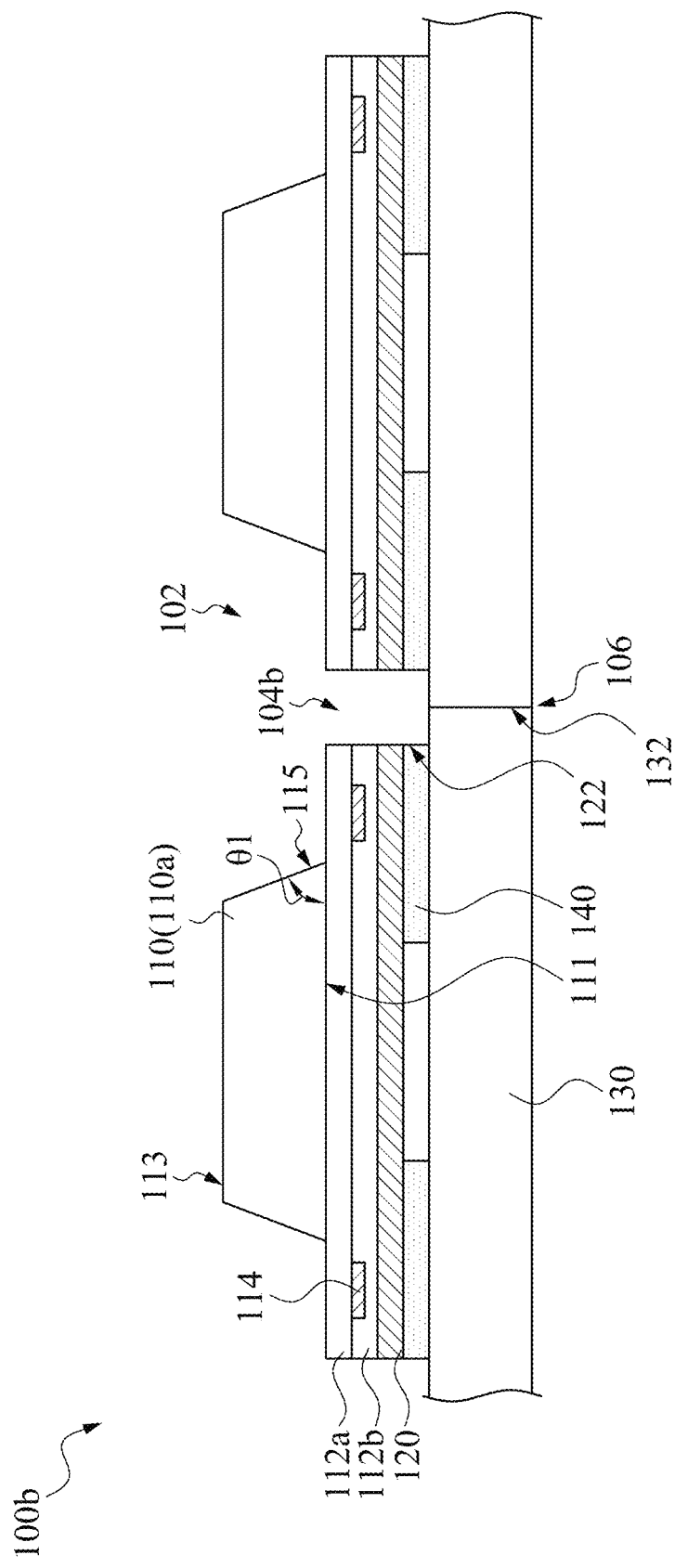

Referring to FIG. 6, in another embodiment, a supporting part 140 can be first formed on the carrier 130 or on the light-transmissive function layer 120 before steps of FIG. 1, and then the carrier 130 is bonded to the light-transmissive function layer 120, such that the supporting part 140 is located between the carrier 130 and the light-transmissive function layer 120. The difference between this embodiment and the embodiment of FIG. 5 is that the first isolation layer 112a, the second isolation layer 112b, the light-transmissive function layer 120 and the supporting part 140 are cut with a first laser along the scribe trench 102 to form a recess 104b, and then the carrier 130 is cut with a second laser along the recess 104b to form a chip package 100b. That is, the recess 104b further extends to the supporting part 140.

Figure 7:
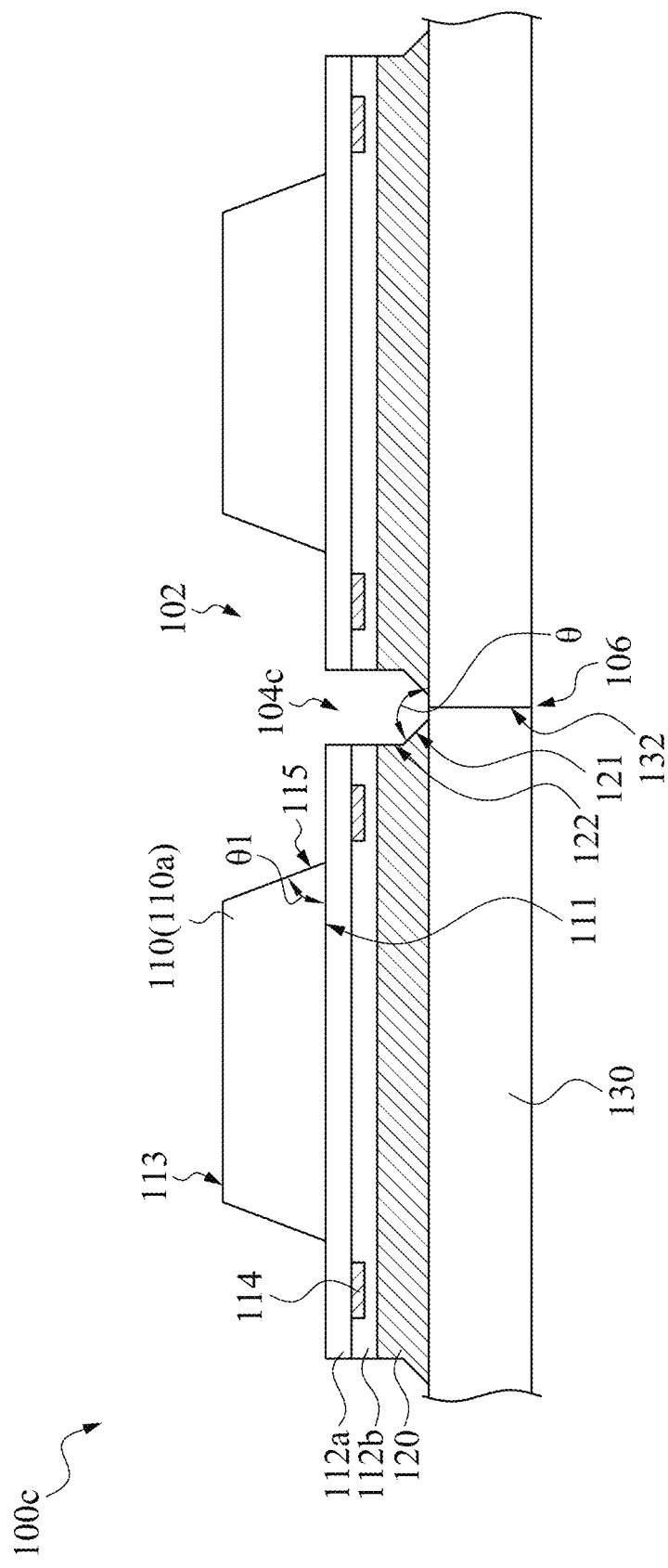

Referring to FIG. 7, in another embodiment, the first isolation layer 112a, the second isolation layer 112b and a portion of the light-transmissive function layer 120 can be cut with a cutter along the scribe trench 102 to form a recess 104c. At this time, the light-transmissive function layer 120 still has another portion located on the carrier 130 in the recess 104c. Next, another portion of the foregoing light-transmissive function layer 120 and the carrier 130 are cut with a laser along the recess 104c to obtain a chip package 100c of FIG. 7. The side face 122 of the light-transmissive function layer 120 of the chip package 100c has an inclined part 121, and an obtuse angle $\theta$ is formed between the inclined part 121 and the carrier 130 that protrudes from the side face 122 of the light-transmissive function layer 120.

Figure 8:
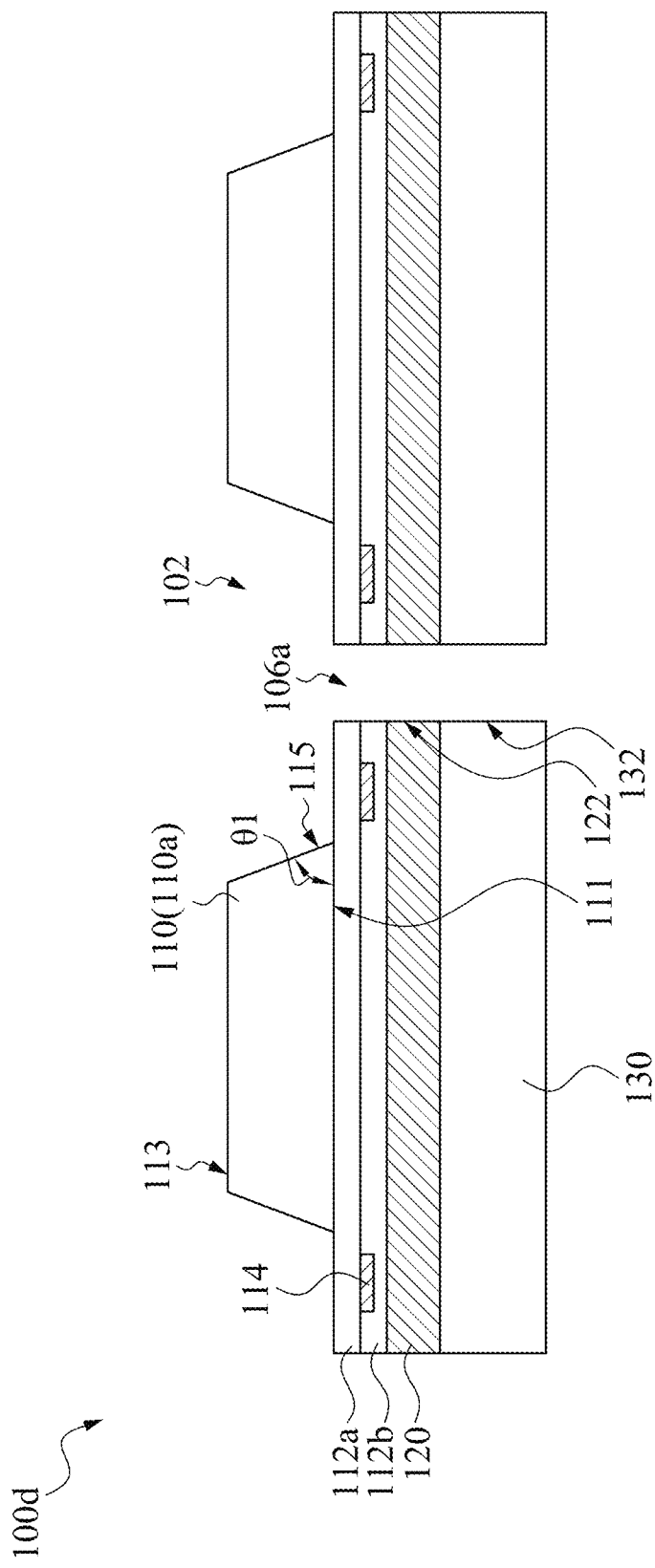

Referring to FIG. 8, in another embodiment, the first isolation layer 112a, the second isolation layer 112b, the light-transmissive function layer 120 and the carrier 130 can be cut with a cutter along the scribe trench 102 to form a recess 106a, to obtain a chip package 100d of FIG. 8. The side face 122 of the light-transmissive function layer 120 of the chip package 100d is coplanar with the side face 132 of the carrier 130 in a continuous vertical surface.

Figure 9:
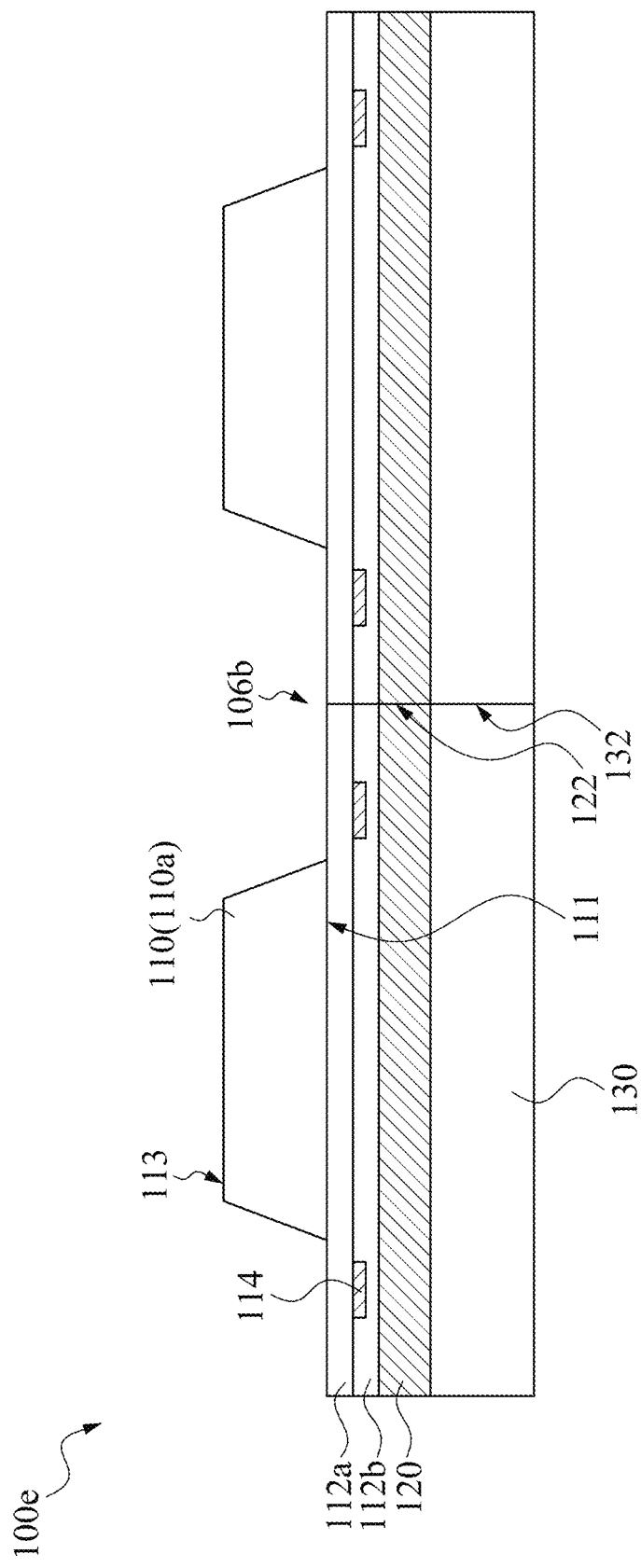

Referring to FIG. 9, in another embodiment, the first isolation layer 112a, the second isolation layer 112b, the light-transmissive function layer 120 and the carrier 130 can be cut with a laser along the scribe trench 102 to form a recess 106b, to obtain a chip package 100e of FIG. 9. The side face 122 of the light-transmissive function layer 120 of the chip package 100e is coplanar with the side face 132 of the carrier 130 in a continuous vertical surface. A width of the gap 106b of FIG. 9 is smaller than that of the gap 106a of FIG. 8.

In the following description, the chip package 100 of FIG. 4 will be taken as an example for the description of a subsequent process. The subsequent process steps of the chip packages 100a-100e of FIGS. 5-9 are the same as those of the chip package 100 of FIG. 4, and the detailed description thereof will not be repeated.

Figure 10:
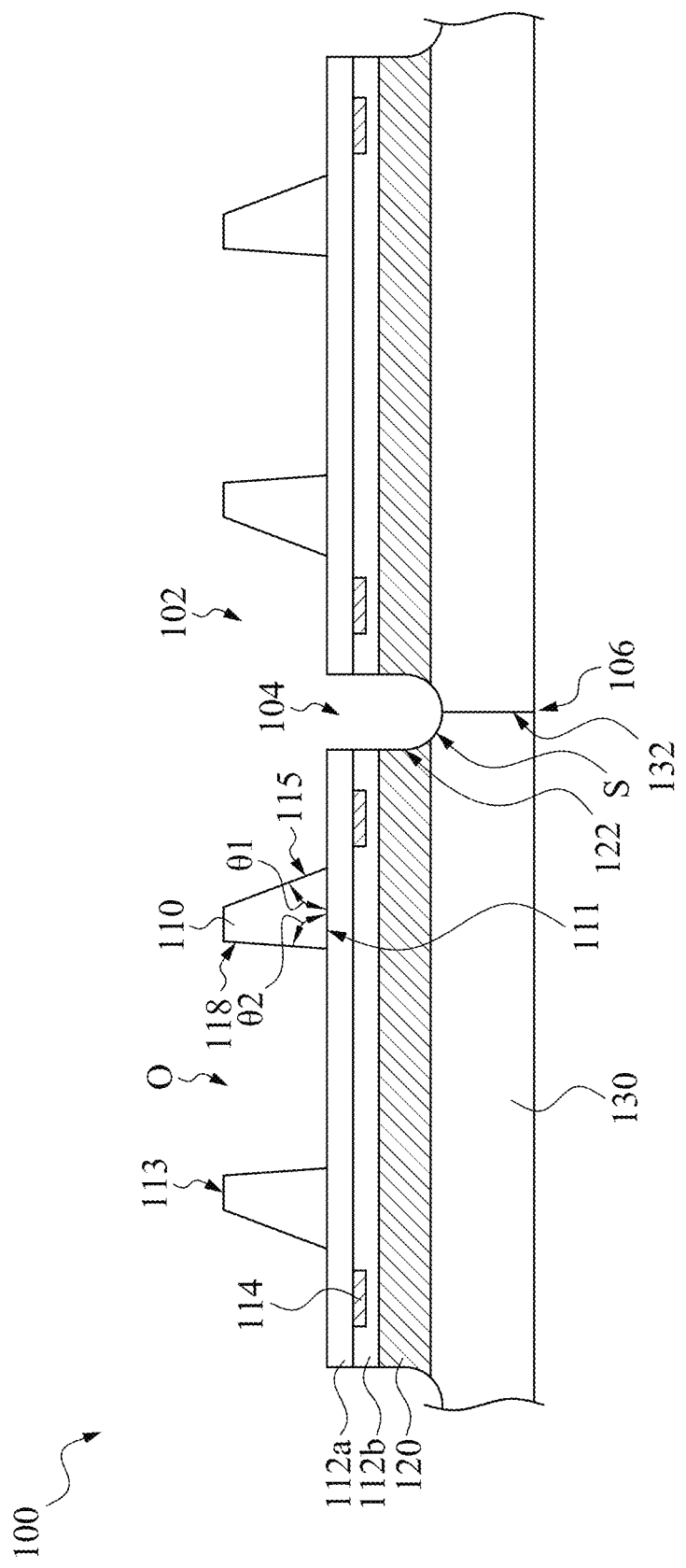

Referring to FIG. 4 and FIG. 10, after the gap 106 of the carrier 130 is formed, the chip 110 can be patterned to form an opening O for defining a sensing area, such as by applying an etching process to the chip 110. The first isolation layer 112a, the second isolation layer 112b and the light-transmissive function layer 120 are located in the opening O, and the first isolation layer 112a is exposed from the opening O. Through this step, the chip 110 has an inner wall surface 118 surrounding the opening O, and the inner wall surface 118 faces away from an outer wall surface 115. A second included angle $\theta2$ is formed between the inner wall surface 118 and a surface 111 of the chip 110, and the first included angle $\theta1$ may be different from the second included angle $\theta2$. In this embodiment, the first included angle $\theta1$ is smaller than the second included angle $\theta2$, but the present invention is not limited thereto. In other embodiments, the first included angle $\theta1$ may be equal to or greater than the second included angle $\theta2$, which is not intended to limit the present invention. Since the first included angle $\theta1$ and the second included angle $\theta2$ of the chip 110 are generated in two patterning steps (such as two etching steps), respectively, the designer can change process parameters according to product requirements to elastically adjust the first included angle $\theta1$ and the second included angle $\theta2$.

Figure 11:
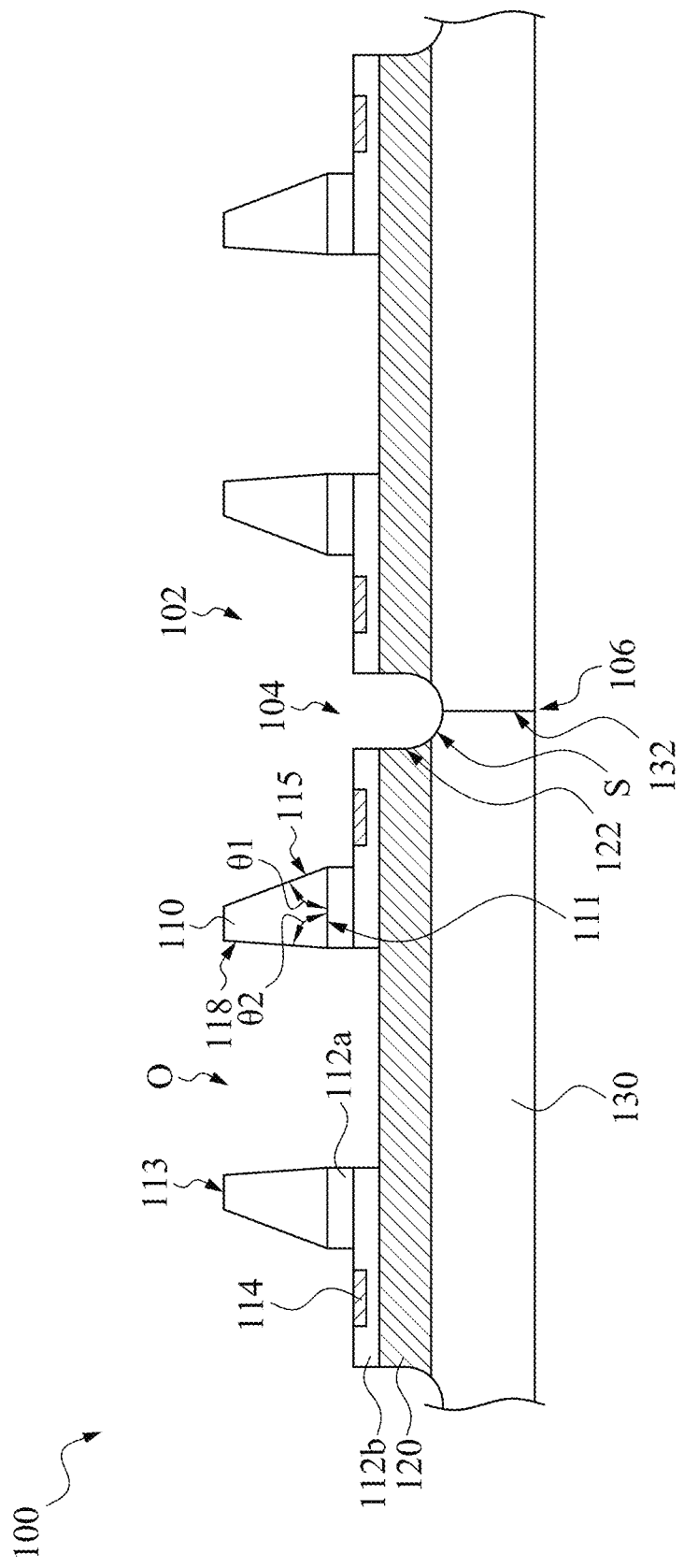
Figure 12:
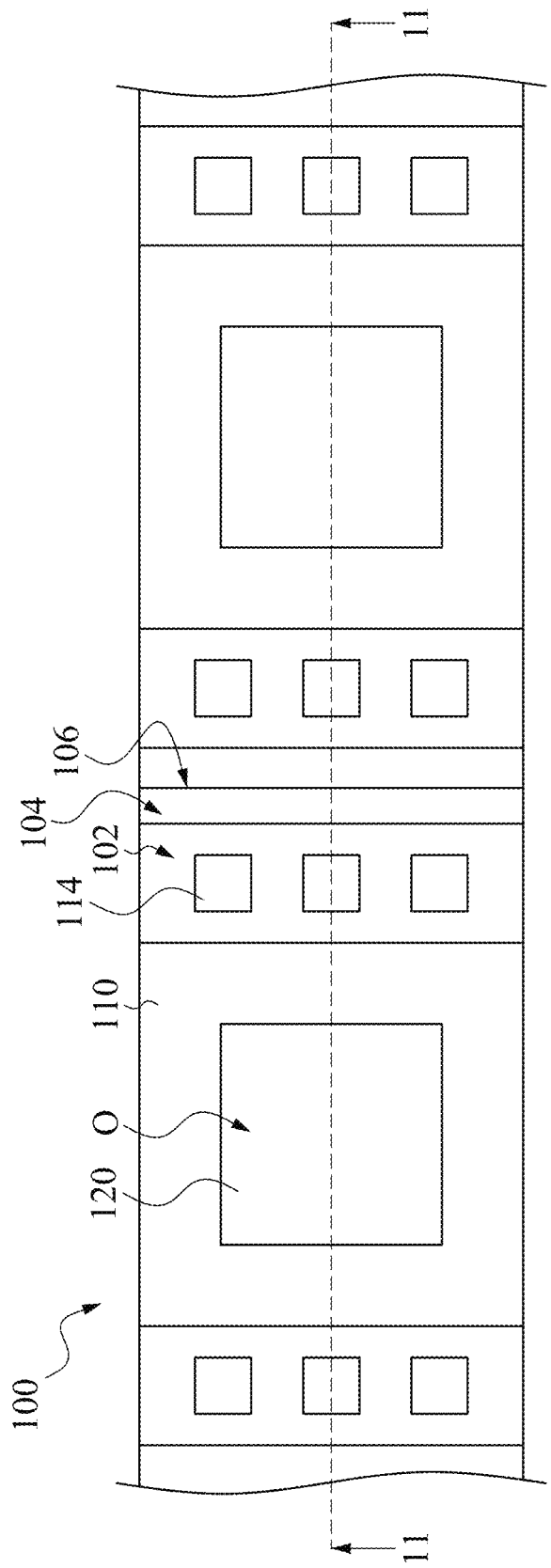
FIG. 12 illustrates a top view of FIG. 11 along a line 11-11.

Referring to FIGS. 11 and 12, FIG. 11 is a top view of FIG. 12 along a line 11-11; After the opening O of the chip 110 is formed, the first isolation layer 112a in the opening O can be etched and the first isolation layer 112a covering the conductive pad 114 can be etched, such that the second isolation layer 112b in the opening O and the conductive pad 114 are both exposed. Next, the second isolation layer 112b in the opening O can be further etched to obtain a chip package 100 of FIG. 11.

Figure 13:
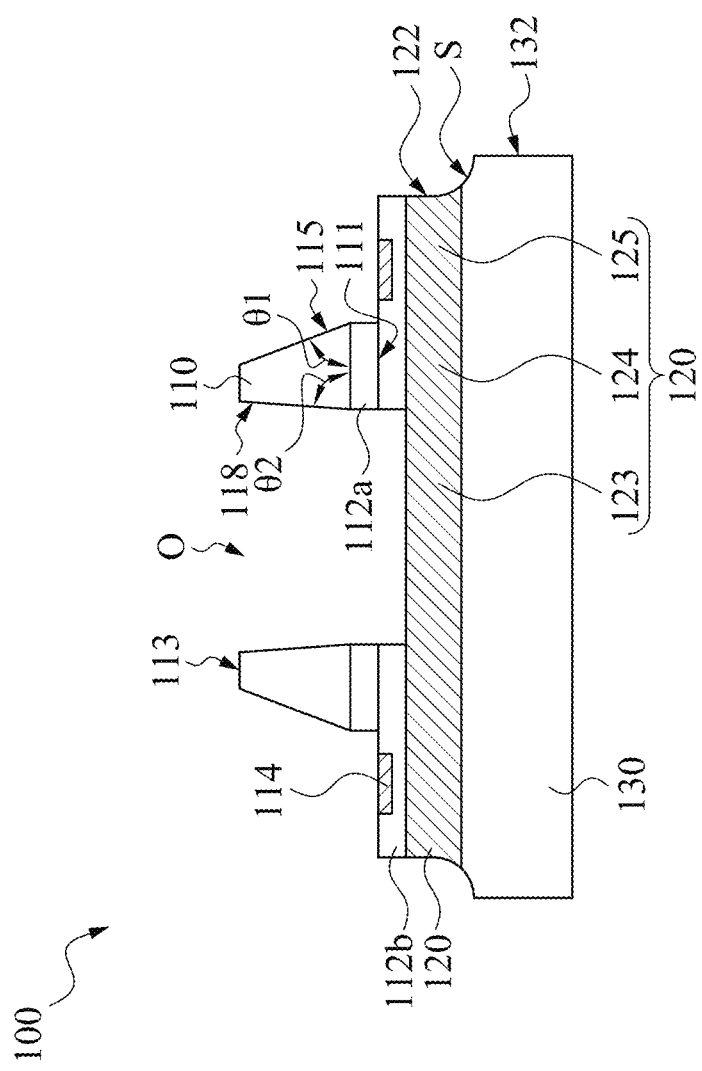
FIG. 13 illustrates a cross-sectional view of a chip package according to an embodiment of the present invention.

FIG. 13 illustrates a cross-sectional view of a chip package 100 according to an embodiment of the present invention. The chip package 100 includes a chip 110, a carrier 130, and a light-transmissive function layer 120. The chip 110 has a conductive pad 114, an opening O defining a sensing area, an inner wall surface 118 surrounding the opening O, and an outer wall surface 115 facing away from the inner wall surface 118. The light-transmissive function layer 120 is located between the chip 110 and the carrier 130. A first portion 123 of the light-transmissive function layer 120 is located in the opening O. A second portion 124 of the light-transmissive function layer 120 is covered by the chip 110. A third portion 125 of the light-transmissive function layer 120 protrudes from the outer wall surface 115 of the chip 110, and the conductive pad 114 is located on the third portion 125. A first included angle θ1 is formed between the outer wall surface 115 of the chip 110 and a surface 111 of the chip 110 facing the light-transmissive function layer 120. A second included angle θ2 is formed between the inner wall surface 118 and the surface 111 of the chip 110, and the first included angle θ1 may be different from the second included angle θ2.

The light-transmissive function layer 120 of the chip package 100 can sense a voltage that is applied by the conductive pad 114, and can deform to change an optical path.

In addition, the chip 110 further has a first isolation layer 112a and a second isolation layer 112b that surround the opening O, the second isolation layer 112b being located on the light-transmissive function layer 120 and protruding from the outer wall surface 115 of the chip 110. The conductive pad 114 is exposed on the second isolation layer 112b, and can be electrically connected to other electronic devices (such as a printed circuit board) by means of a wire bonding process.

In summary, since the wafer 110a is patterned to form the scribe trench 102, then the light-transmissive function layer 120 and the carrier 130 are cut along the scribe trench 102, and then the chip 110 is patterned to form the opening O that defines the sensing area, the sensing area of the chip 110 can be prevented from damage when the cutting process is executed, thereby improving the product yield. In addition, the step of forming the scribe trench 102 by the wafer 110a and the step of forming the opening O by the chip 110 are not performed simultaneously, such that an inclination angle of the inner wall surface 118 of the chip 110 surrounding the opening O and an inclination angle of the outer wall surface 115 facing away from the inner wall surface 118 (namely the outer wall surface 115 facing the scribe trench 102) can be determined as required by the designer. In this way, the manufacturing method of a chip package 100 and the chip package 100 can be applied to different types of optical sensors.

Figure 14:
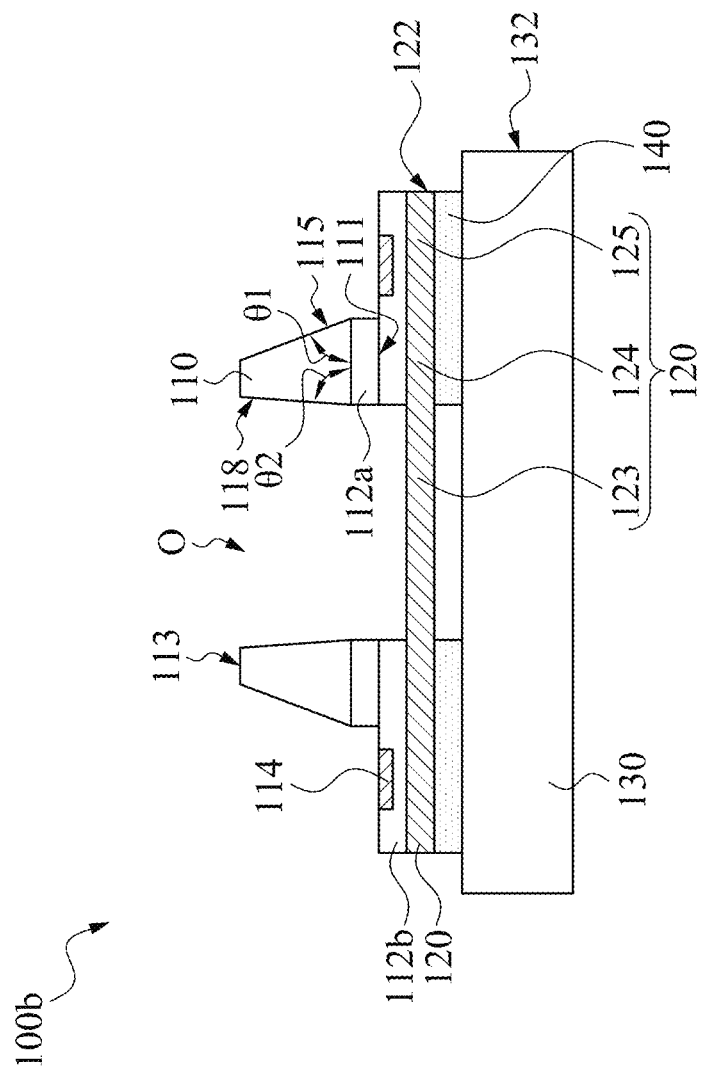
FIG. 14 illustrates a cross-sectional view of a chip package according to an embodiment of the present invention.

FIG. 14 illustrates a cross-sectional view of a chip package 100b according to an embodiment of the present invention. The difference between this embodiment and the embodiment of FIG. 13 is that the chip package 100b further includes a supporting part 140. The supporting part 140 is located between the light-transmissive function layer 120 and the carrier 130. In addition, the supporting part 140 overlaps the second portion 124 and the third portion 125 of the light-transmissive function layer 120. The side face 122 of the light-transmissive function layer 120 of the chip package 100b is substantially parallel to the side face 132 of the carrier 130. The chip package 100b of FIG. 14 can be formed by the step of forming the opening O in FIG. 10 by the chip package 100b of FIG. 6 and the step of etching the first isolation layer 112a and the second isolation layer 112b in FIG. 11.

Figure 15:
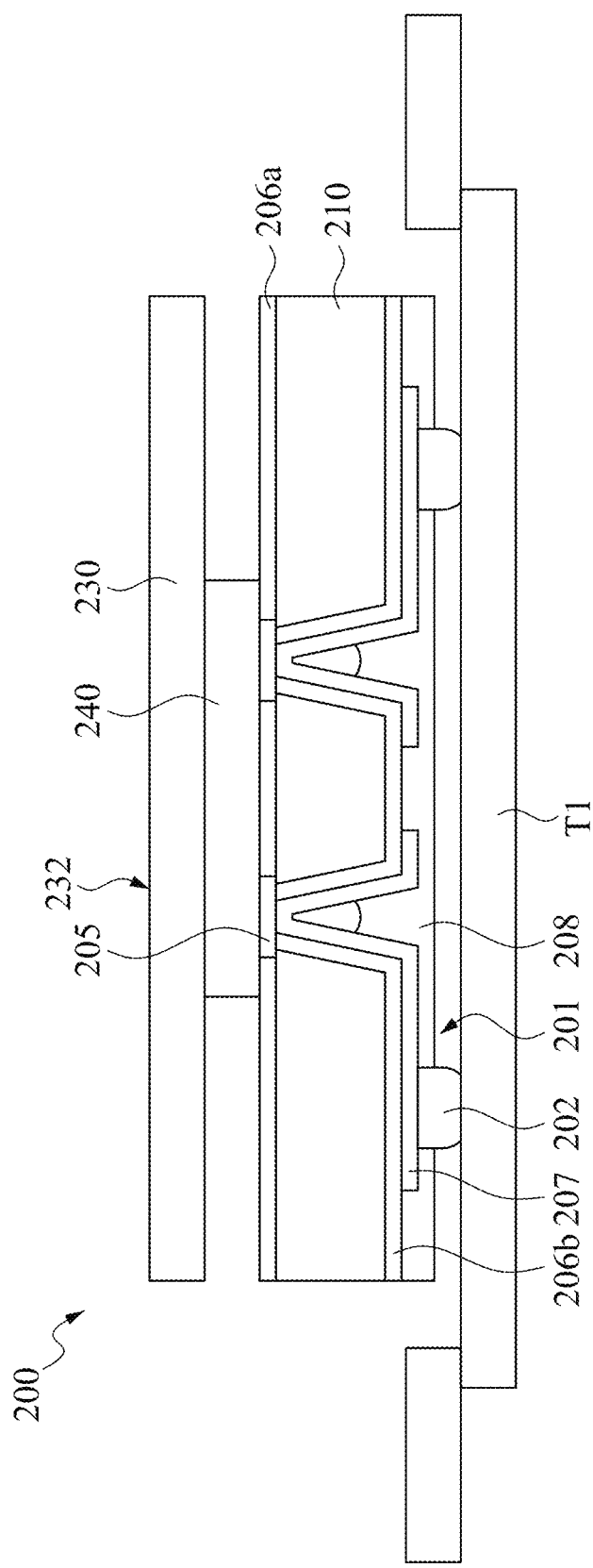
FIGS. 15-18 illustrate cross-sectional views of steps of a manufacturing method of a chip package according to an embodiment of the present invention.

FIGS. 15-18 illustrate cross-sectional views of steps of a manufacturing method of a chip package 100f (see FIG. 18) according to an embodiment of the present invention. As shown in FIG. 15, a side 201 of a package structure 200 is first attached to a first adhesive tape T1, in which the package structure 200 may have a carrier 230 facing away from the side 201, the carrier 230 has an outward top surface 232, and the top surface 232 is a plane for subsequent direct illumination by a modified laser.

In this embodiment, the material of the carrier 230 may be glass. For example, the material of the carrier 230 may be optical glass, but is not limited thereto. The package structure 200 further includes a conductive structure 202 located on the side 201, a wafer 210 that has not been cut, a supporting part 240, a conductive pad 205, isolation layers 206a and 206b, a redistribution layer 207, and a protective layer 208. The package structure 200 is a wafer level package to be cut into a chip package. A lower side 201 (such as the conductive structure 202) of the package structure 200 adheres to the first adhesive tape T1. In addition, the supporting part 240 is located between the wafer 210 and the carrier 230.

Figure 16:
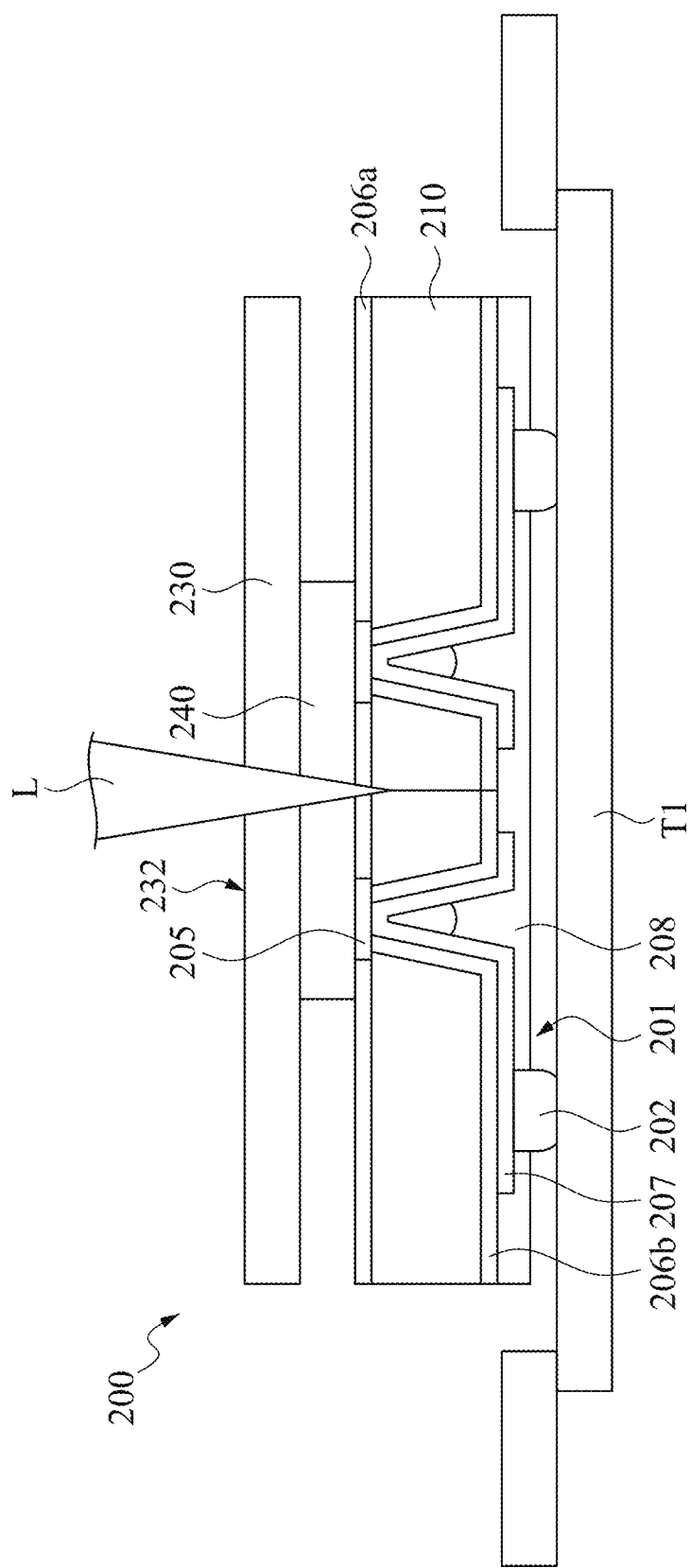

Referring to FIG. 16, the package structure 200 is cut from the top surface 232 of the carrier 230 with a modified laser L. The modified laser L differs from a general laser in that the modified laser L does not use destructive processing, but uses a mechanism of stress release in a workpiece to cause a crack, so the modified laser L has less pollution and improves reliability compared with conventional cutting. The modified laser lens L focuses on the inside of an object to be cut, and scans in a horizontal direction to make the object to be cut generate an internal crack, which makes it easy to achieve separation by stress in a subsequent process. Since the modified laser L can be used to cut a composite material, in addition to cutting the carrier 230, the modified laser L can further cut the supporting part 240 and the wafer 210 below the carrier 230. The modified laser L is used for the purpose of cutting in a sintering manner and focuses on a depth range of the object to be cut to form a crack inside the object to be cut.

Figure 23:
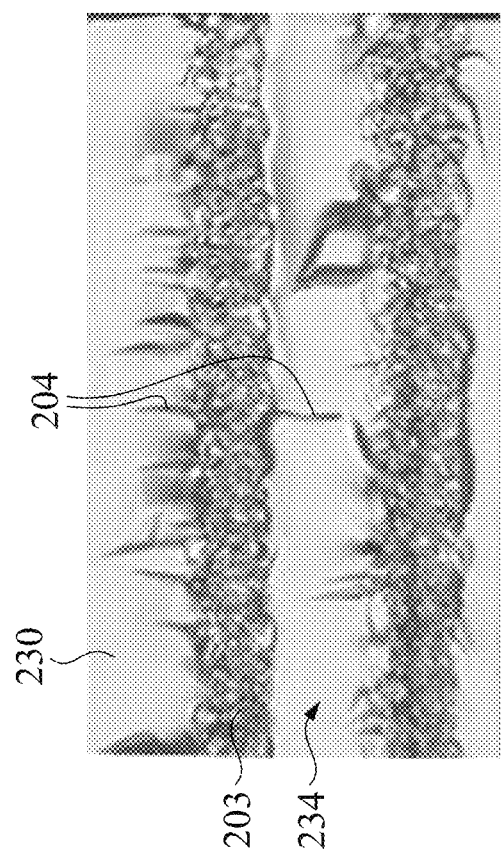
FIG. 23 illustrates a side view of a side face of a carrier of FIG. 22.

As shown in FIG. 23, after the carrier 230 is cut with the modified laser L, an internal stress layer 203 can be formed in an interior of the carrier 230 (namely a side face 234 after the cutting) and a crack 204 can be formed extending up and down from the internal stress layer 203. Adjustment parameters of the modified laser L can be determined according to a laser wavelength and a type and a thickness of the object to be cut. The modified laser L can save the process steps of cutting the wafer level package and reduce the volume of a material removed to avoid waste. In addition, the advantages of the modified laser L further include less heat affect zone (HAZ), less chipping, smaller debris (Debris), less contamination, higher cutting speed, and less scribe line area. The size of the debris can be less than 10 μm.

Figure 17:
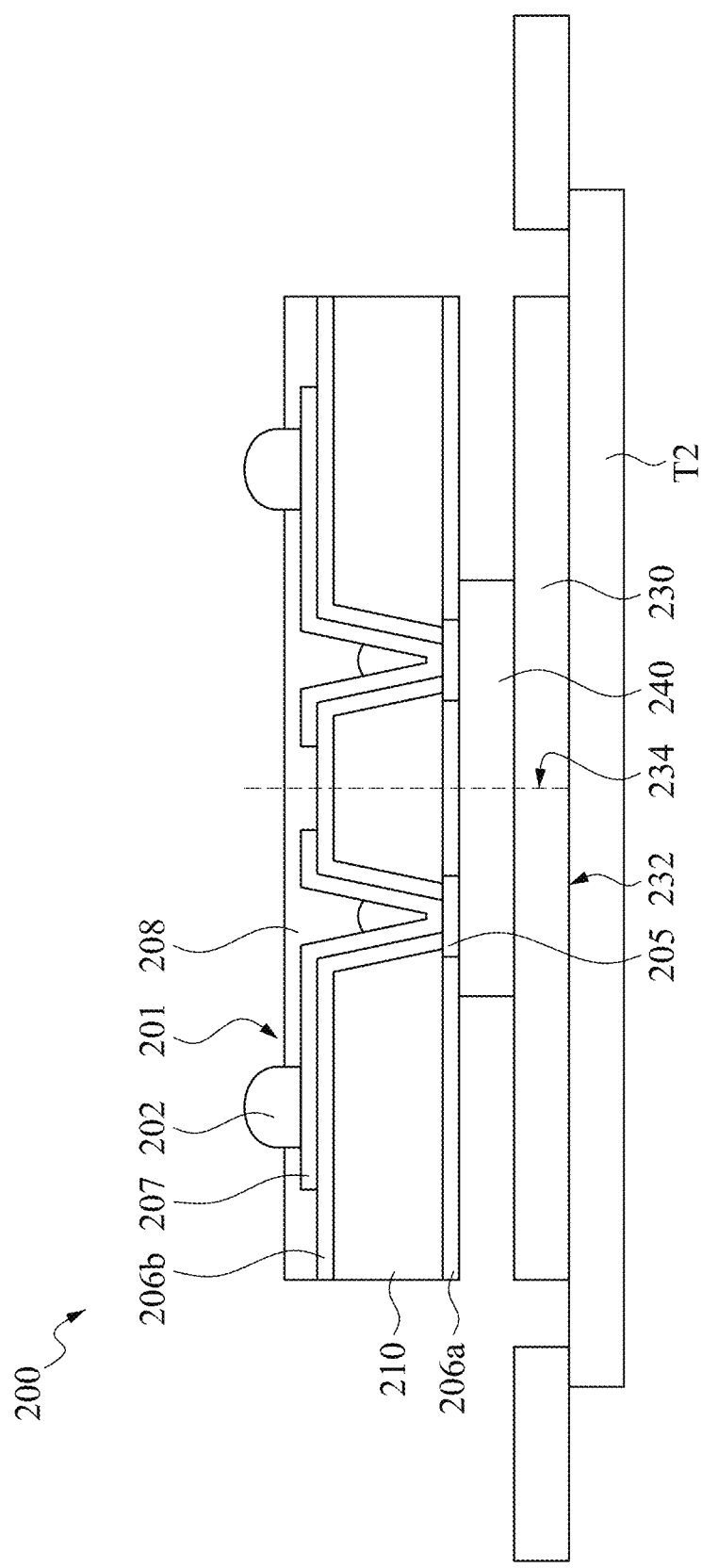

Referring to FIGS. 16 and 17, after the cutting process is executed by using the modified laser L, a second adhesive tape T2 is attached to the top surface 232 of the carrier 230 and then overturned by 180 degrees, and the first adhesive tape T1 attached to the conductive structure 202 is removed.

Figure 18:
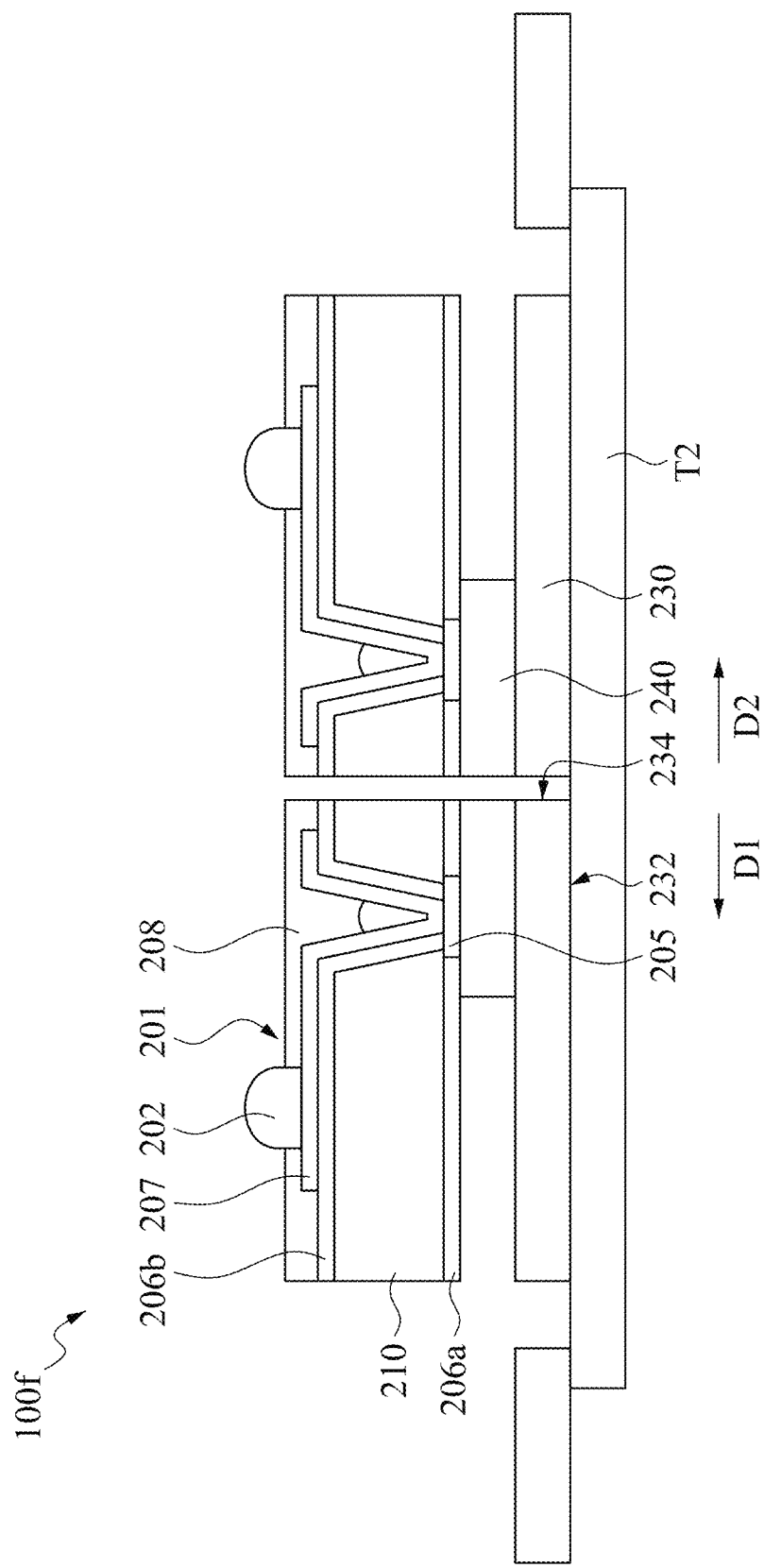

Referring to FIG. 18, next, the second adhesive tape T2 can be expanded (for example, the second adhesive tape T2 is tensioned by force in opposite directions D1 and D2). Since the wafer 210, the supporting part 240 and the carrier 230 have been sintered by the modified laser L, when the second adhesive tape T2 is expanded, the package structure 200 can be easily divided into a plurality of chip packages 100f.

Figure 19:
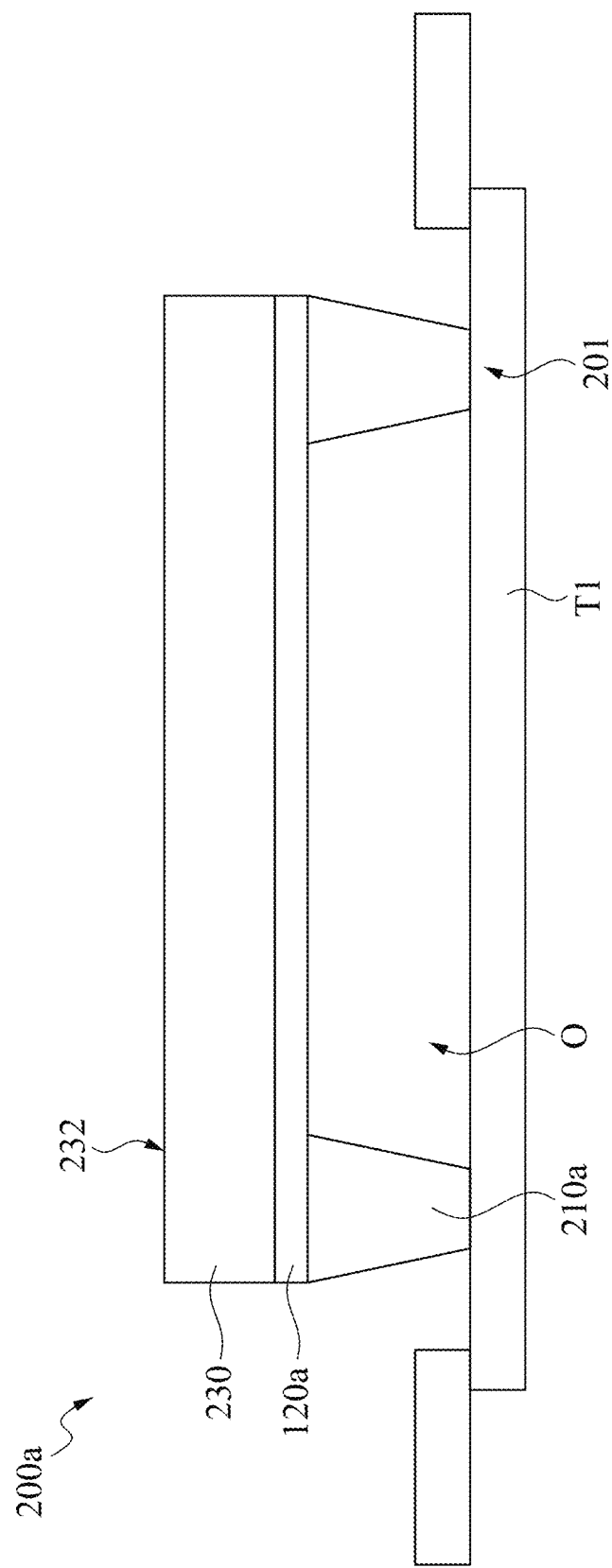
FIGS. 19-22 illustrate cross-sectional views of steps of a manufacturing method of a chip package according to an embodiment of the present invention.

FIGS. 19-22 illustrate cross-sectional views of steps of a manufacturing method of a chip package 100g (see FIG. 22) according to an embodiment of the present invention. As shown in FIG. 19, a side 201 of a package structure 200a is first attached to a first adhesive tape T1, in which the package structure 200a has a carrier 230 facing away from the side 201, the carrier 230 has an outward top surface 232, and the top surface 232 is a plane for subsequent direct illumination by a modified laser.

In this embodiment, the material of the carrier 230 may be glass, but is not limited thereto. The package structure 200a further includes a wafer 210a that has not been cut but has an opening O, and a light-transmissive function layer 120a. The material of the light-transmissive function layer 120a may be a polymer, but is not limited thereto. The package structure 200a is a wafer level package to be cut into a chip package. A lower side 201 of the package structure 200a (such as the wafer 210a) adheres to the first adhesive tape T1. In addition, the light-transmissive function layer 120a is located between the wafer 210a and the carrier 230. The configuration of FIG. 19 can prevent the light-transmissive function layer 120a facing the opening O and the wafer 210a from being in contact with process water (such as cooling water), omitting the cost of coating a waterproof layer.

Figure 20:
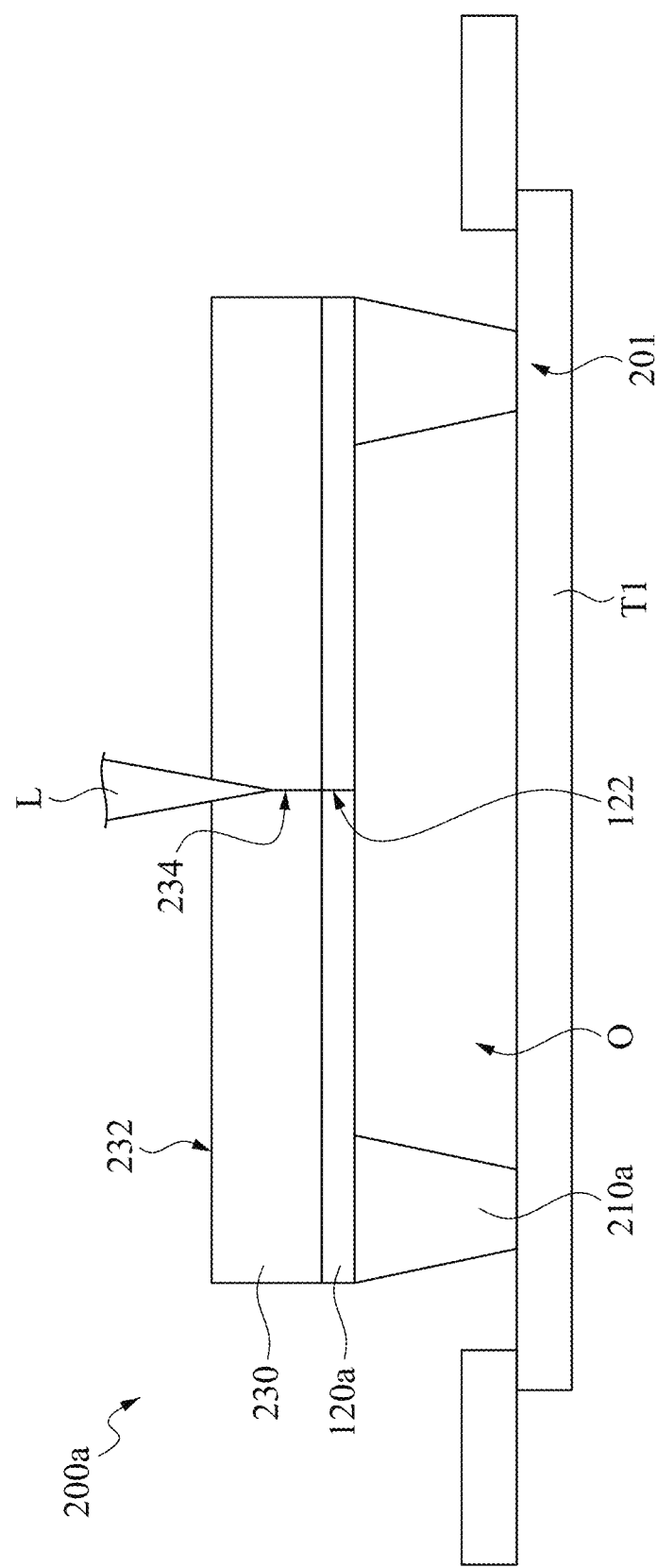
Figure 24:
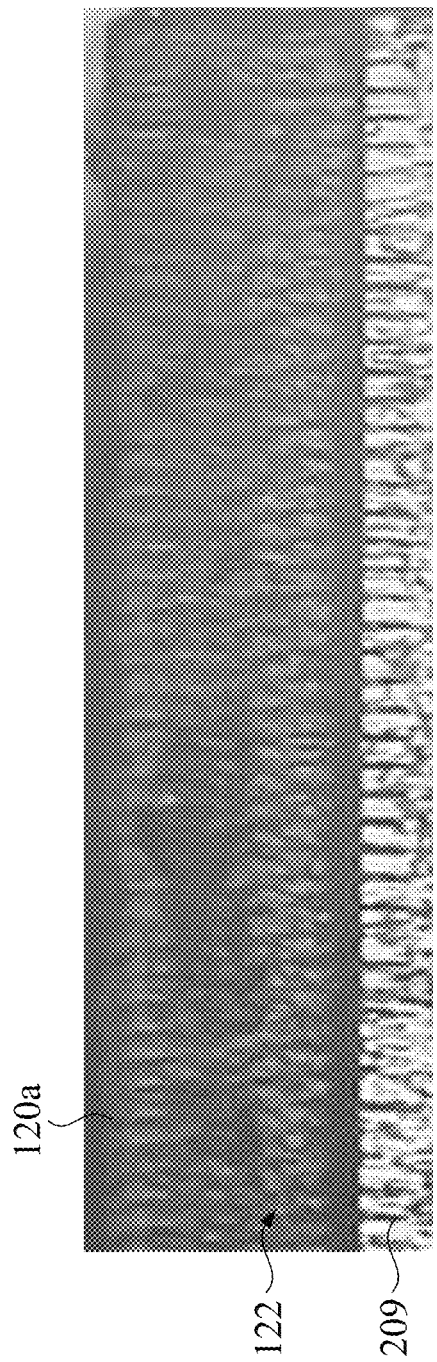
FIG. 24 illustrates a side view of a side face of a light-transmissive function layer of FIG. 22.

Referring to FIG. 20, the package structure 200a is cut from the top surface 232 of the carrier 230 with a modified laser L. The characteristics and advantages of the modified laser L will not be repeated. Since the modified laser L can be used to cut a composite material, in addition to cutting the carrier 230, the modified laser L can further cut the light-transmissive function layer 120a. In this embodiment, after the carrier 230 is cut with the modified laser L, an interior of the carrier 230 (namely a side face 234 after the cutting) has an internal stress layer 203 as shown in FIG. 23 and a crack 204 extending up and down from the internal stress layer 203, and a line mark 209 as shown in FIG. 24 is formed in an interior of the light-transmissive function layer 120a (namely a side face 122 after cutting).

Figure 21:
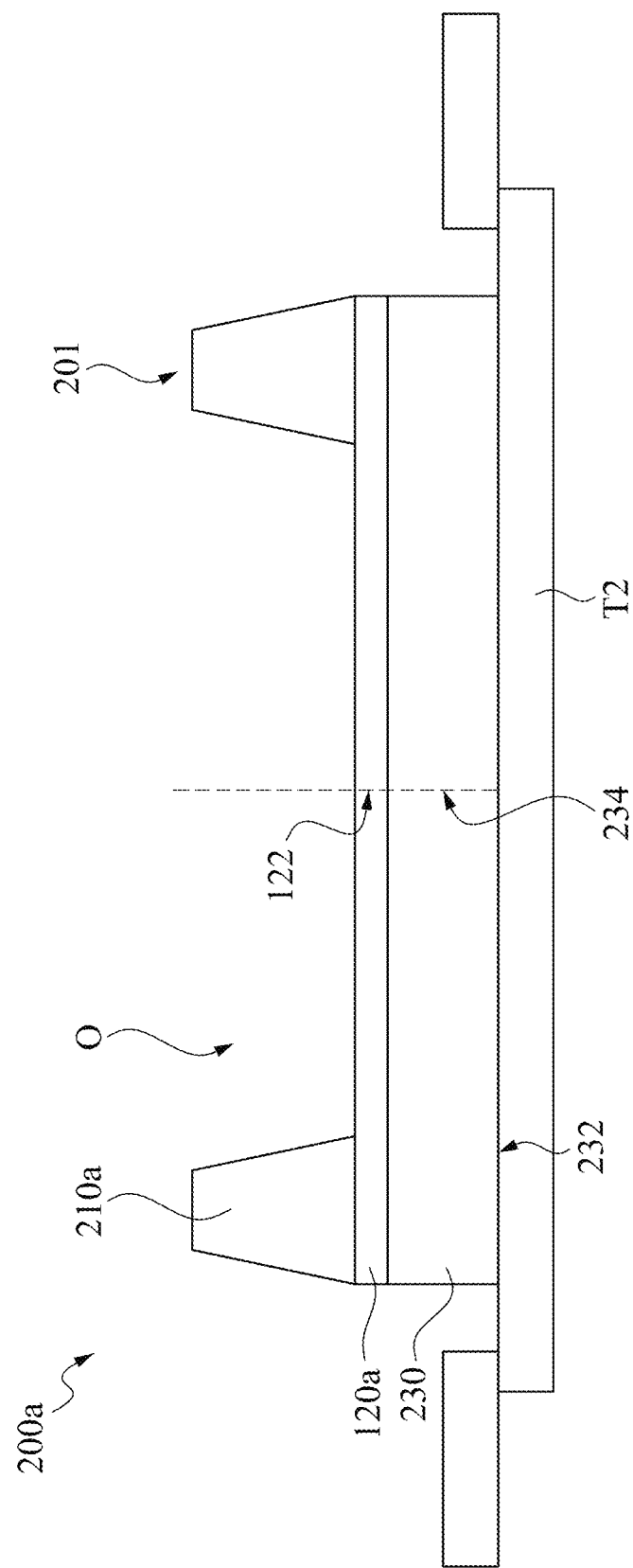

Referring to FIGS. 20 and 21, after the cutting process is executed by using the modified laser L, a second adhesive tape T2 is attached to the top surface 232 of the carrier 230 and then overturned by 180 degrees, and the first adhesive tape T1 attached to the wafer 210a is removed.

Figure 22:
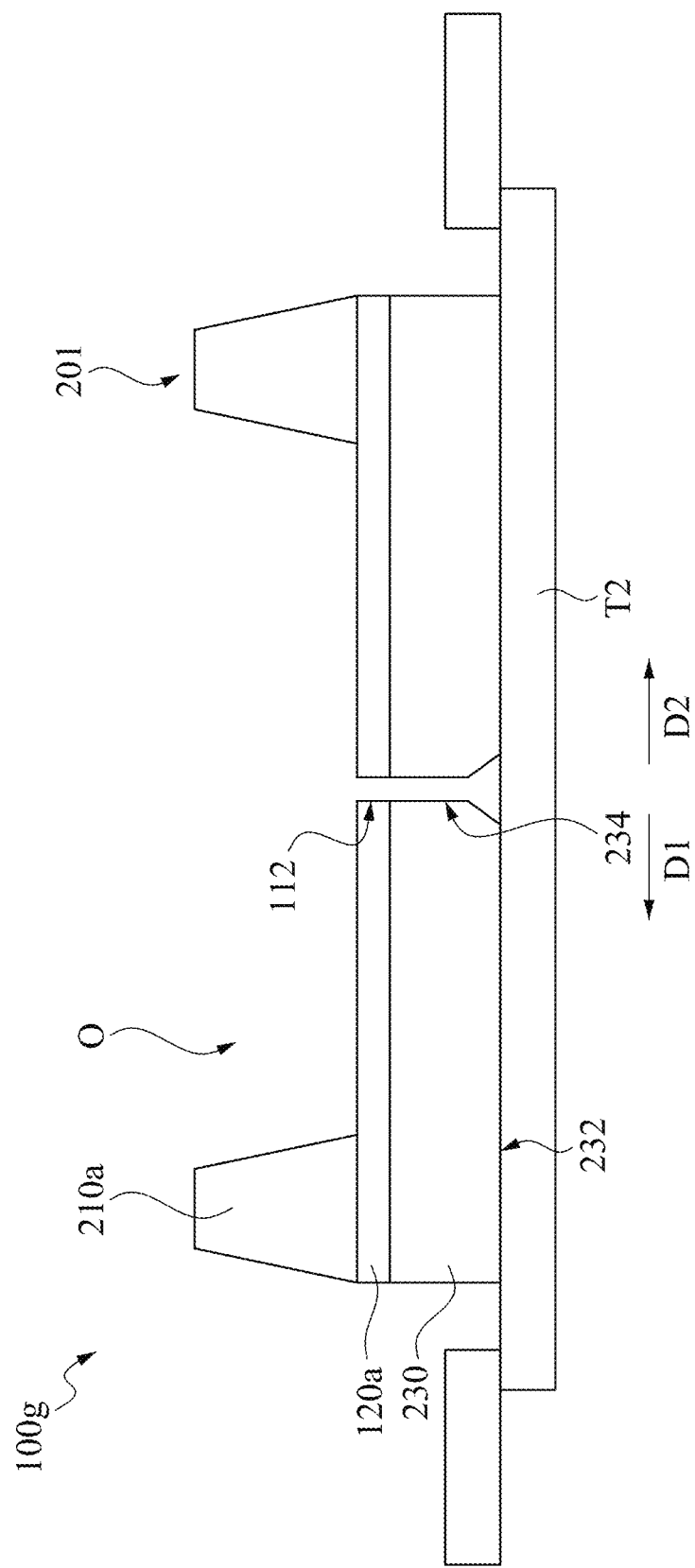

Next referring to FIG. 22, the second adhesive tape T2 can be expanded (for example, the second adhesive tape T2 is tensioned by force in opposite directions D1 and D2). Since the light-transmissive function layer 120a and the carrier 230 have been sintered by the modified laser L, when the second adhesive tape T2 is expanded, the package structure 200a can be easily divided into a plurality of chip packages 100g.

Figure 25:
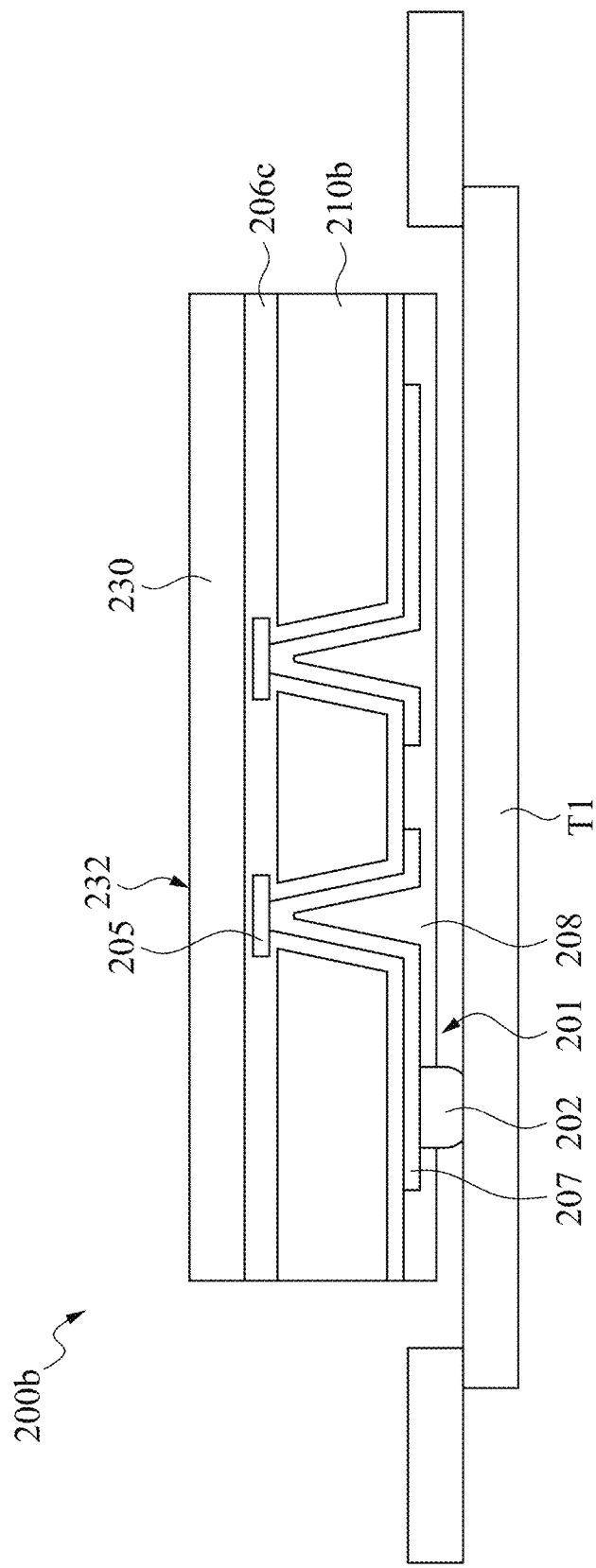
FIGS. 25-28 illustrate cross-sectional views of steps of a manufacturing method of a chip package according to an embodiment of the present invention.

FIGS. 25-28 illustrate cross-sectional views of steps of a manufacturing method of a chip package 100h according to an embodiment of the present invention. As shown in FIG. 25, a side 201 of a package structure 200b is first attached to a first adhesive tape T1, in which the package structure 200b may have a carrier 230 facing away from the side 201, the carrier 230 has an top surface 232 facing outward, and the top surface 232 is a plane for subsequent direct illumination by a modified laser.

In this embodiment, the material of the carrier 230 may be glass. For example, the material of the carrier 230 may be optical glass, but is not limited thereto. The package structure 200b further includes a conductive structure 202 located on the side 201, a wafer 210b that has not been cut, a conductive pad 205, an isolation layer 206c, a redistribution layer 207, and a protective layer 208. The package structure 200b is a wafer level package to be cut into a chip package. A lower side 201 (such as the conductive structure 202 and the protective layer 208) of the package structure 200b adheres to the first adhesive tape T1.

Figure 26:
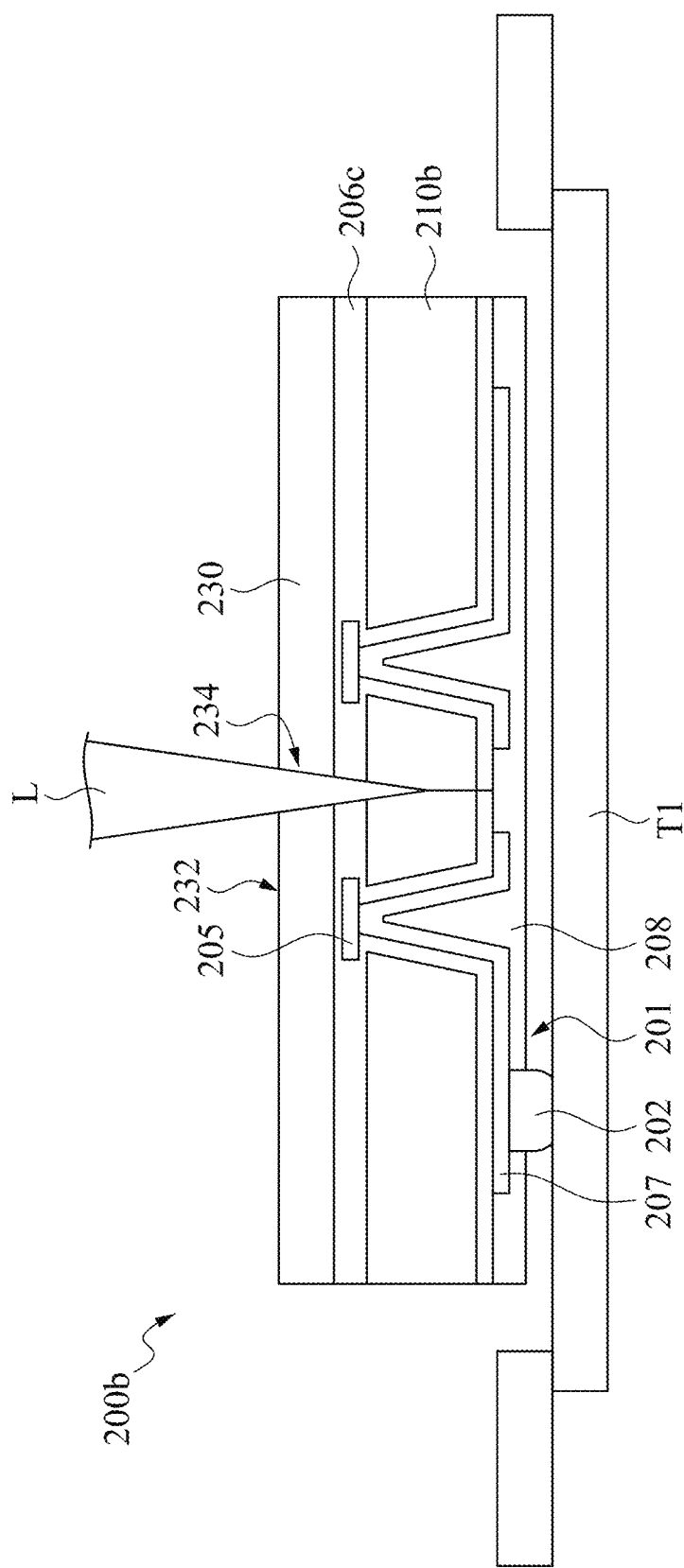

Referring to FIG. 26, the package structure 200b is cut from the top surface 232 of the carrier 230 with a modified laser L. The characteristics and advantages of the modified laser L will not be repeated herein. Since the modified laser L can be used to cut a composite material, in addition to cutting the carrier 230, the modified laser L can further cut the wafer 210b. In this embodiment, after the carrier 230 is cut with the modified laser L, an interior of the carrier 230 (namely a side face 234 after the cutting) has an internal stress layer 203 as shown in FIG. 23 and a crack 204 extending up and down from the internal stress layer 203.

Figure 27:
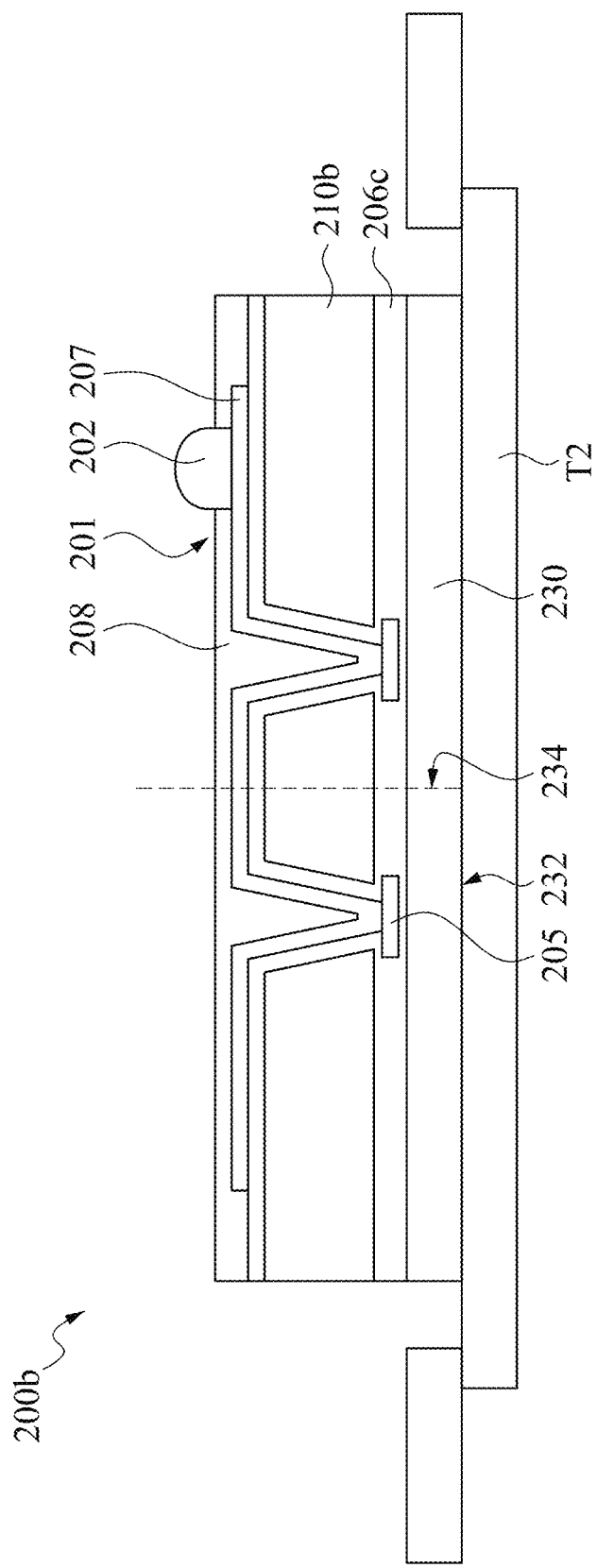

Referring to FIGS. 26 and 27, after the cutting process is executed by using the modified laser L, a second adhesive tape T2 is attached to the top surface 232 of the carrier 230 and then overturned by 180 degrees, and the first adhesive tape T1 attached to the wafer 210b is removed.

Figure 28:
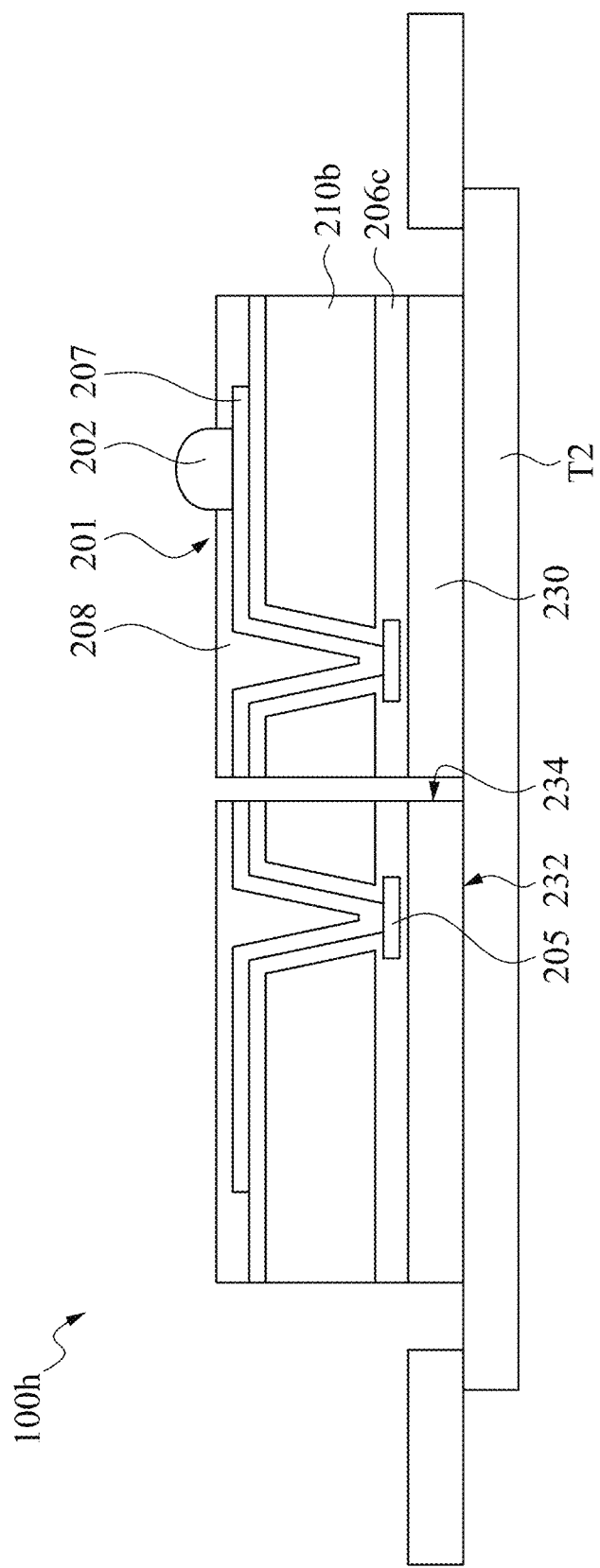

Next referring to FIG. 28, the second adhesive tape T2 can be expanded (for example, the second adhesive tape T2 is tensioned by force in opposite directions D1 and D2). Since the carrier 230 of the wafer 210b have been sintered by the modified laser L, when the second adhesive tape T2 is expanded, the package structure 200b can be easily divided into a plurality of chip packages 100h.

The foregoing modified laser L can also be applied to the lasers mentioned in the foregoing FIGS. 1-14.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A manufacturing method of a chip package, comprising:
    patterning a wafer to form a scribe trench, wherein a light-transmissive function layer below the wafer is in the scribe trench, the light-transmissive function layer is between the wafer and a carrier, the wafer has an outer wall surface facing the scribe trench, and a first included angle is formed between the outer wall surface and a surface of the wafer facing the light-transmissive function layer;
    cutting the light-transmissive function layer and the carrier along the scribe trench to form a chip package, wherein the chip package comprises a chip, the light-transmissive function layer, and the carrier; and
    patterning the chip to form an opening that defines a sensing area, wherein the light-transmissive function layer is in the opening, the chip has an inner wall surface surrounding the opening and the outer wall surface that faces away from the inner wall surface, a second included angle is formed between the inner wall surface and a surface of the chip facing the light-transmissive function layer, and the first included angle is different from the second included angle.

2. The manufacturing method of the chip package of claim 1, further comprising:
grinding a surface of the wafer facing away from the light-transmissive function layer.

3. The manufacturing method of the chip package of claim 1, further comprising:
forming a supporting part on the carrier or on the light-transmissive function layer; and
bonding the carrier to the light-transmissive function layer such that the supporting part is located between the carrier and the light-transmissive function layer.

4. The manufacturing method of the chip package of claim 1, wherein cutting the light-transmissive function layer and the carrier along the scribe trench comprises:
cutting the light-transmissive function layer and a portion of the carrier with a cutter to form a recess; and
cutting another portion of the carrier with a laser along the recess.

5. The manufacturing method of the chip package of claim 1, wherein cutting the light-transmissive function layer and the carrier along the scribe trench comprises:
cutting the light-transmissive function layer with a first laser to form a recess; and
cutting the carrier with a second laser along the recess.

6. The manufacturing method of the chip package of claim 1, wherein cutting the light-transmissive function layer and the carrier along the scribe trench comprises:
cutting a portion of the light-transmissive function layer with a cutter to form a recess; and
cutting another portion of the light-transmissive function layer and the carrier with a laser along the recess.

7. The manufacturing method of the chip package of claim 1, wherein cutting the light-transmissive function layer and the carrier along the scribe trench is performed by a cutter or a laser.

8. The manufacturing method of the chip package of claim 1, wherein the chip has a first isolation layer and a second isolation layer on the light-transmissive function layer, the second isolation layer is located between the light-transmissive function layer and the first isolation layer, and the manufacturing method of a chip package further comprises:
etching the first isolation layer in the opening and etching the first isolation layer covering a conductive pad of the chip, such that the second isolation layer in the opening and the conductive pad are both exposed.

* * * * *